United States Patent
Dasgupta et al.

(10) Patent No.: US 12,237,816 B2
(45) Date of Patent: Feb. 25, 2025

(54) MILLIMETER WAVE TRANSMITTER DESIGN

(71) Applicant: Intel Corporation, Santa Clara, CA (US)

(72) Inventors: Kaushik Dasgupta, Hillsboro, OR (US); Chuanzhao Yu, Phoenix, AZ (US); Chintan Thakkar, Portland, OR (US); Saeid Daneshgar, Portland, OR (US); Hyun Yoon, Gilbert, AZ (US); Xi Li, Wenzhou (CN); Anandaroop Chakrabarti, Beaverton, OR (US); Stefan Shopov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 787 days.

(21) Appl. No.: 17/405,780

(22) Filed: Aug. 18, 2021

(65) Prior Publication Data

US 2022/0038069 A1 Feb. 3, 2022

Related U.S. Application Data

(63) Continuation of application No. 17/315,931, filed on May 10, 2021, now Pat. No. 11,632,092, which is a
(Continued)

(51) Int. Cl.
*H03F 3/60* (2006.01)
*H01F 17/00* (2006.01)
(Continued)

(52) U.S. Cl.
CPC ......... *H03F 3/604* (2013.01); *H01F 17/0013* (2013.01); *H01F 27/29* (2013.01);
(Continued)

(58) Field of Classification Search
CPC .... H03F 3/604; H03F 1/3211; H03F 3/45179; H03F 2200/451; H03F 2203/45228;
(Continued)

(56) References Cited

U.S. PATENT DOCUMENTS

| 4,816,784 | A | 3/1989 | Rabjohn |
| 7,164,339 | B2 | 1/2007 | Huang |

(Continued)

FOREIGN PATENT DOCUMENTS

| CN | 103377809 B | 4/2016 |
| CN | 108702169 A | 10/2018 |

(Continued)

OTHER PUBLICATIONS

Niknejad, A M, "A circuit designer's guide to 5G mm-wave", 2015 IEEE Custom Integrated Circuits Conference (CICC), (2015), pp. 1-8.
(Continued)

*Primary Examiner* — Andrea Lindgren Baltzell
*Assistant Examiner* — Jose E Pinero
(74) *Attorney, Agent, or Firm* — Schwegman Lundberg & Woessner, P.A.

(57) ABSTRACT

An on-chip transformer circuit is disclosed. The on-chip transformer circuit comprises a primary winding circuit comprising at least one turn of a primary conductive winding arranged as a first N-sided polygon in a first dielectric layer of a substrate; and a secondary winding circuit comprising at least one turn of a secondary conductive winding arranged as a second N-sided polygon in a second, different, dielectric layer of the substrate. In some embodiments, the primary winding circuit and the secondary winding circuit are arranged to overlap one another at predetermined locations along the primary conductive winding and the secondary conductive winding, wherein the predetermined loca-
(Continued)

tions comprise a number of locations less than all locations along the primary conductive winding and the secondary conductive winding.

21 Claims, 21 Drawing Sheets

Related U.S. Application Data continuation of application No. 16/177,790, filed on Nov. 1, 2018, now Pat. No. 11,031,918.

(51) Int. Cl.
    *H01F 27/29*       (2006.01)
    *H03F 1/32*        (2006.01)
    *H03F 3/45*        (2006.01)
    *H03H 7/42*       (2006.01)

(52) U.S. Cl.
    CPC ....... *H03F 1/3211* (2013.01); *H03F 3/45179* (2013.01); *H03H 7/42* (2013.01); *H03F 2200/451* (2013.01); *H03F 2203/45228* (2013.01); *H03F 2203/45731* (2013.01)

(58) Field of Classification Search
    CPC ..... H03F 2203/45731; H03F 2200/423; H03F 2200/537; H03F 2200/541; H03F 3/26; H03F 3/45475; H03F 3/602; H01F 17/0013; H01F 27/29; H01F 19/04; H01F 2027/2809; H01F 2027/2819; H01F 27/2804; H03H 7/42
    USPC ........................................................ 330/252
See application file for complete search history.

(56) References Cited

U.S. PATENT DOCUMENTS

| | | | |
|---|---|---|---|
| 7,755,464 | B2 | 7/2010 | Hisamitsu |
| 7,821,372 | B2 | 10/2010 | Ho-hsiang |
| 8,552,828 | B1 | 10/2013 | Beer et al. |
| 9,330,832 | B2 | 5/2016 | Swirhun et al. |
| 11,031,918 | B2 | 6/2021 | Dasgupta et al. |
| 11,387,535 | B2 * | 7/2022 | Lee .......................... H01F 19/04 |
| 11,632,092 | B2 | 4/2023 | Dasgupta et al. |
| 2004/0227608 | A1 | 11/2004 | Nakatani et al. |
| 2009/0261935 | A1 | 10/2009 | Hisamitsu |
| 2020/0144976 | A1 | 5/2020 | Dasgupta et al. |
| 2021/0313943 | A1 | 10/2021 | Dasgupta et al. |

FOREIGN PATENT DOCUMENTS

| | | |
|---|---|---|
| CN | 112912977 A | 6/2021 |
| WO | WO-2020091937 A1 | 5/2020 |

OTHER PUBLICATIONS

"Amplifier Classes, Amplifiers are classified into classes according to their construction and operating characteristics", Amplifier Classes and the Classification of Amplifiers, [Online] Retrieved from the internet: <https://www.electronics-tutorials.ws/amplifier/amplifier-classes html>, 9 pgs.
"U.S. Appl. No. 16/177,790, Non Final Office Action mailed Oct. 29, 2020", 9 pgs.
"U.S. Appl. No. 16/177,790, Notice of Allowance mailed Feb. 8, 2021", 5 pgs.
"U.S. Appl. No. 16/177,790, Response filed Jan. 28, 2021 to Non Final Office Action mailed Oct. 29, 2020", 11 pgs.
"U.S. Appl. No. 16/177,790, Response filed Apr. 24, 2020 to Restriction Requirement mailed Apr. 17, 2020", 7 pgs.
"U.S. Appl. No. 16/177,790, Restriction Requirement mailed Apr. 17, 2020", 5 pgs.
"U.S. Appl. No. 17/315,931, Preliminary Amendment filed Jun. 25, 2021", 12 pages.
"Chapter 4: Differential Amplifiers", McGraw-Hill Education, (2017), 60 pgs.
"Differential amplifier", Wikipedia, [Online] Retrieved from the internet: <https://en.wikipedia.org/wiki/Differential_amplifier>, 11 pgs.
"International Application Serial No. PCT/US2019/053972, International Preliminary Report on Patentability mailed May 14, 2021", 12 pgs.
"International Application Serial No. PCT/US2019/053972, International Search Report mailed Mar. 10, 2020", 7 pgs.
"International Application Serial No. PCT/US2019/053972, Invitation to Pay Additional Fees mailed Jan. 14, 2020", 10 pgs.
"International Application Serial No. PCT/US2019/053972, Written Opinion mailed Mar. 10, 2020", 10 pgs.
"Understanding Power Splitters", Mini-Circuits. AN-10-006 Rev.: A M150261 (Apr. 14, 2015) File: AN10006.doc, 8 pgs.
"What is Saturated Output Power in an Amplifier? Exodus Advanced Communications", [Online] Retrieved from the internet: <https://www.everythingrf.com/community/what-is-saturated-output-power-in-an-amplifier>, 2 pgs.
Agarwal, Tarun, "Class D Amplifiers Operation and Applications", Knowledge Space. Class D Amplifier Circuit Operation and Its Applications, [Online] Retrieved from the internet: <https://www.elprocus.com/class-d-amplifier-operation-applications/>, 6 pgs.
Aoki, I.chiro, et al., "Distributed Active Transformer—A New Power-Combining and Impedance-Transformation Technique", IEEE Transactions on Microwave Theory and Techniques, vol. 50, No. 1, (Jan. 2002), 16 pgs.
Aoki, I.chiro, "Distributed Active Transformer for Integrated Power Amplification", (Thesis by) California Institute of Technology, Pasadena, California (Defended Oct. 31, 2001 )., (2002), 214 pgs.
Bhat, Ritesh, et al., "Large-Scale Power-Combining and Linearization in Watt-Class mmWave CMOS Power Amplifiers", IEEE Radio Frequency Integrated Circuits Symposium, (2013), 283-286.
Chakrabarti, Anandaroop, et al., "High-Power High-Efficiency Class-E-Like Stacked mmWave PAs in SOI and Bulk CMOS: Theory and Implementation", IEEE Transactions on Microwave Theory and Techniques, vol. 62, No. 8, (Aug. 2014), 19 pgs.
Dabag, Hayg-Taniel, et al., "Analysis and Design of Stacked-FET Millimeter-Wave Power Amplifiers", IEEE Transactions on Microwave Theory and Techniques, vol. 61, No. 4, (Apr. 2013), 14 pgs.
Hajimiri, Ali, "Distributed Active Transformers Bring CMOS PAs to Life", EE Times, [Online] Retrieved from the internet: <https://www.eetimes.com/document.asp?doc_id=1207711>, 5 pgs.
Jayamon, Jefy A, et al., "Multigate-Cell Stacked FET Design for Millimeter-Wave CMOS Power Amplifiers", IEEE Journal of Solid-State Circuits, vol. 51, No. 9, (Sep. 2016), 2027-2039.
Lefrak, Fred, et al., "How RF Transformers Work and How They Are Measured", AN-20-001 Rev.: BM150261 (Apr. 15, 2015). File: AN20001.W61, 16 pgs.
Lndirayanti, Paramartha, et al., "A 32 GHz 20 dBM-Psat Transformer-based Doherty Power Amplifier for multi-GB/s 5G Applications in 28 nm Bulk CMOS", IEEE Radio Frequency Integrated Circuits Symposium, (2017), 45-48.
Pang, Ka-Wo, "Application Derived Inductor and Transformer", University of Washington, 37 pgs.
Sarkar, Anirban, et al., "A 28-GHz SiGe BiCMOS PA with 32% Efficiency and 23-dBm Output Power", IEEE Journal of Solid-State Circuits, vol. 52, No. 6, (Jun. 2017), 1680-1686.
Sarkas, Loannis, et al., "A 45nm SOI CMOS Class-D mm-Wave PA with >10Vpp Differential Swing", IEEE International Solid-State Circuits Conference. ISSCC 2012 /Session 4 /RF Techniques/ 4.8, (2012), 88-90.
Zhang, Yang, et al., "A High-Efficiency Linear Power Amplifier for 28GHz Mobile Communications in 40nm CMOS", IEEE Radio Frequency Integrated Circuits Symposium., (2017), 33-36.
Zhao, Dixian, et al., "A 40-nm CMOS E-Band 4-Way Power Amplifier With Neutralized Bootstrapped Cascode Amplifier and

(56) References Cited

OTHER PUBLICATIONS

Optimum Passive Circuits", IEEE Transactions on Microwave Theory and Techniques, vol. 63, No. 12, (Dec. 2015), 4083-4089.
Zhao, Yi, et al., "A Wideband, Dual-Path, Millimeter-Wave Power Amplifier With 20 dBm Output Power and PAE Above 15% in 130 nm SiGe-BiCMOS", IEEE Journal of Solid-State Circuits, vol. 47, No. 9, (Sep. 2012), 1981-1997.
Zhou, Tiger, "Stacked-FET switches enable high-efficiency, high-density solutions", Analog Applications Journal. Texas Instruments AAJ 1Q 2015, 4 pgs.
"U.S. Appl. No. 17/315,931, Supplemental Notice of Allowability mailed Dec. 28, 2022", 4 pgs.
"U.S. Appl. No. 17/315,931, Supplemental Notice of Allowability mailed Jan. 19, 2023", 3 pgs.
"U.S. Appl. No. 17/315,931, Supplemental Notice of Allowability mailed Feb. 23, 2023", 2 pgs.
"Indian Application Serial No. 202047053762, Response filed May 1, 2023 to First Examination Report mailed Oct. 31, 2022", w English claims, 9 pgs.
"U.S. Appl. No. 17/315,931, Supplemental Notice of Allowability mailed Feb. 13, 2023", 2 pgs.

\* cited by examiner

MILLIMETER WAVE TRANSMITTER DESIGN

FIELD

The present disclosure relates to millimeter wave (mm-Wave) systems, and in particular, to a system and method for transmitter design in mmWave systems.

BACKGROUND

Mobile communication has evolved significantly from early voice systems to today's highly sophisticated integrated communication platform. The next generation wireless communication system, 5G, or new radio (NR) will provide access to information and sharing of data anywhere, anytime by various users and applications. The mobile wireless products inherently operate on batteries having limited charge and need to be compact and cost-effective while providing a high performance. Most of the power dissipation in mobile wireless products is due to their transmitters, more specifically, the power amplifier. Therefore, increasing the power efficiency, and reducing the size and the cost of the transmitters, while keeping other specifications within the standard is a key factor to the evolution of overall performance of the wireless mobile products.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
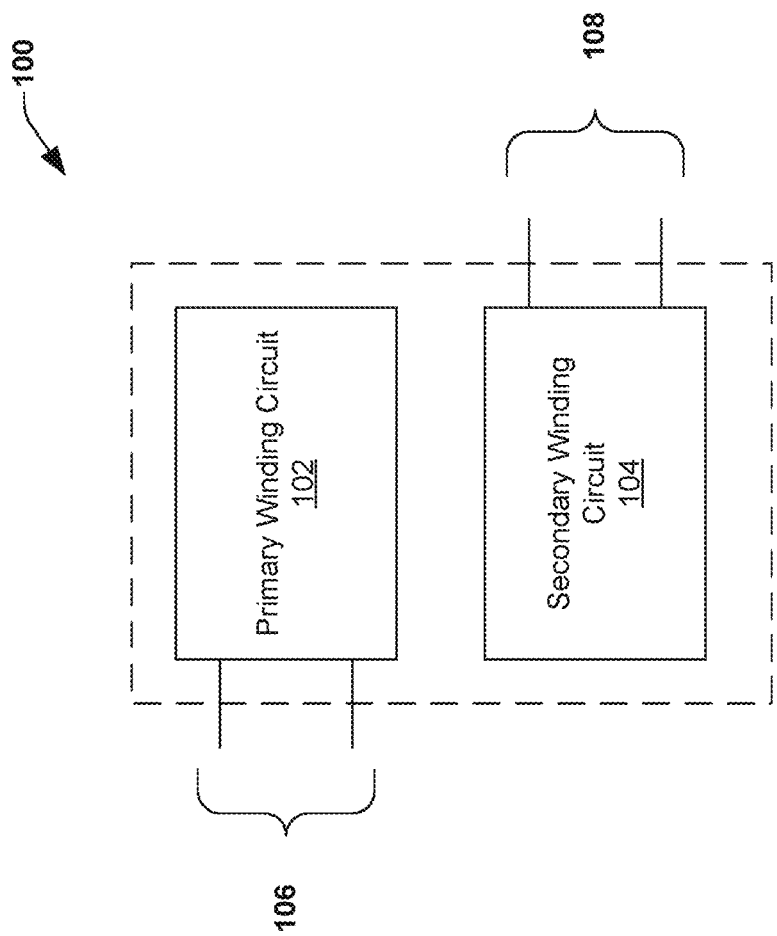
FIG. 1 illustrates an exemplary simplified block diagram of an on-chip transformer circuit, according to various embodiments described herein.

In one embodiment of the disclosure, an on-chip transformer circuit is disclosed. The on-chip transformer circuit comprises a primary winding circuit comprising at least one turn of a primary conductive winding arranged as a first N-sided polygon in a first dielectric layer of a substrate; and a secondary winding circuit comprising at least one turn of a secondary conductive winding arranged as a second N-sided polygon in a second, different, dielectric layer of the substrate. In some embodiments, the primary winding circuit and the secondary winding circuit are arranged to overlap one another at predetermined locations along the primary conductive winding and the secondary conductive winding. In some embodiments, the predetermined locations comprise a number of locations less than all locations along the primary conductive winding and the secondary conductive winding.

In one embodiment of the disclosure, a distributed active transformer (DAT) power combiner circuit is disclosed. The DAT power combiner circuit comprises a first DAT circuit comprising a first primary winding circuit comprising a first primary conductive loop comprising at least two input ports configured to receive at least two input signals, respectively associated therewith; and a first secondary winding circuit comprising a first secondary conductive loop comprising a first output port configured to provide a first output signal, based on the at least two input signals associated with the first primary winding circuit. The DAT power combiner circuit further comprises a second DAT circuit comprising a second primary winding circuit comprising a second primary conductive loop comprising at least two input ports configured to receive at least two input signals, respectively associated therewith; and a second secondary winding circuit comprising a second secondary conductive loop comprising a second output port configured to provide a second output signal, based on the at least two input signals associated with the second primary winding circuit, wherein the two input signals associated with the primary winding circuit and the two input signals associated with the secondary winding circuit are different. In some embodiments, the first DAT circuit and the second DAT circuit are physically arranged in a way that the first output port of the first DAT circuit and the second output port of the second DAT circuit face one another from opposite directions.

In one embodiment of the disclosure, a stacked differential amplifier circuit is disclosed. The stacked differential amplifier circuit comprises a differential amplifier circuit comprising a first differential output terminal and a second differential output terminal. In some embodiments, the stacked differential amplifier circuit further comprises a stacked amplifier circuit, comprising a first stacked transistor circuit comprising a first stacked terminal coupled to the first differential output terminal of the differential amplifier circuit; and a second stacked transistor circuit comprising a fourth stacked terminal coupled to the second differential output terminal of the differential amplifier circuit. In some embodiments, the differential amplifier circuit comprises a plurality of unit cell amplifier circuits in parallel, each unit cell amplifier circuit comprising a first unit cell transistor circuit comprising a first transistor terminal and a second transistor terminal; and a second unit cell transistor circuit comprising a fourth transistor terminal and a fifth transistor terminal. In some embodiments, the first transistor terminal of the first unit cell transistor circuit and the fourth transistor terminal of the second unit cell transistor circuit are coupled to one another to form a differential arrangement. In some embodiments, the second transistor terminal of the first unit cell transistor circuit associated with each of the unit cell amplifier circuits are coupled together to form the first differential output terminal; and the fifth transistor terminal of the second unit cell transistor circuit associated with each of the unit cell amplifier circuits are coupled together to form the second differential output terminal. In some embodiments, each of the unit cell amplifier circuits is configured to be selectively activated or deactivated, based on the output requirements of the stacked differential amplifier circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers, A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with certain functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, increasing the power efficiency, and reducing the size and the cost of the transmitters, while keeping other specifications within the standard is a key factor to the evolution of overall performance of the wireless mobile products. Among the several building blocks associated with wireless transmitters, power amplifiers have been one of the most challenging. Designing a high efficiency power amplifier is a major challenge in transmitter design. Further, impedance transformation and power combining are major challenges in power amplifier design. In some embodiments, on-chip transformers are utilized in transmitters for impedance transformation associated with power amplifiers. Utilizing an efficient on-chip transformer for impedance transformation is essential for efficient operation of transmitters. Further, in some embodiments, power combiners are utilized in transmitters for combining power associated with one or more power amplifiers. Utilizing an efficient power combiner circuit for power combining is also essential for efficient operation of transmitters.

In current implementations of transmitters, various on-chip transformer designs are utilized. For example, in some embodiments, a coplanar interleaved transformer, which has the primary and secondary windings interleaved on the same integrated circuit layer is utilized. Due to the complexity of the windings and flux leakage, the coplanar interleaved transformer has low quality (Q) and low coupling coefficient (k). Further, in some embodiments, toroidal and concentric transformers are implemented in multi-layer metal windings. However, they suffer from weak coupling, asymmetrical center tap location. Furthermore, in some embodiments, overlay transformers that include primary windings on one layer and secondary windings on another layer are utilized. The primary side and secondary side windings are overlapped to achieve high coupling coefficient. However, the short distance between the upper metal layer windings and lower layer windings introduces high parasitic capacitance, which lowers the self-resonance frequency (SRF). Therefore, the overlay transformer design does not work well for mmWave applications. In order to overcome the above disadvantages, an on-chip transformer circuit comprising a primary winding circuit in a first dielectric layer and a secondary winding circuit in a second, different dielectric layer is proposed in this disclosure. In some embodiments, the primary winding circuit and the secondary winding circuit are arranged to overlap one another at predetermined locations along the primary conductive winding and the secondary conductive winding. In some embodiments, the predetermined locations comprise a number of locations less than all locations along the primary conductive winding and the secondary conductive winding, further details of which are given in embodiments below.

Similarly, in current implementations of transmitters, various power combiner designs are utilized. For example, in one embodiment, a single distributed active transformer (DAT) that combines the power from 2 differential amplifiers is utilized as the power combiner. In some embodiments, the said DAT uses dummy metal to balance the capacitive coupling in single-ended operation of the DAT. However, a single DAT combines only two differential PAs. In another embodiment, a power combiner that use two DATs in parallel is utilized. In some embodiments, the said power combiner combines the power of four differential PAs and therefore, have more output power. However, they don't have methodology to balance the capacitive coupling in single-ended operation of the DATs. Therefore, port imbalance increases loss and consequently degrades the combining efficiency. More importantly, the two employed DATs are both placed on one side of an output RF pad. This physical placement requires extra leads from DATs to reach to the RF pad which increases the loss of the power combiner. Further, in another embodiment, a power combiner that use two parallel regular transformers and combine the power of two differential PAs is utilized. The said power combiner has less port imbalance compared to the single-ended DAT, but it is less efficient as it occupies larger area and also requires extra lead from transformers to the RF pad, as the two parallel transformers are placed on the same side of an output RF pad. In order to overcome the above disadvantages, a DAT power combiner circuit comprising a first DAT circuit that combines the power from a first set of 2 differential amplifiers and a second DAT circuit that combines the power from second, different, set of 2 differential amplifiers, thereby combining the power from 4 differential PAs is proposed in this disclosure. In particular, the first DAT circuit and the second DAT circuit are physically arranged in a way that output ports of the first DAT circuit and the second DAT circuit face one another from opposite directions. In some embodiments, such a physical arrangement enables the first DAT circuit and the second DAT circuit to couple to a radio frequency (RF) pad placed between the first DAT circuit and the second DAT circuit from a minimum distance.

Similarly, in current implementations of transmitters, various power amplifier (PA) designs are utilized. For example, in some embodiments, a power amplifier circuit design that involves stacking two or more transistors in Bulk CMOS or SOI CMOS is utilized. In some embodiments, the stacked transistors are arranged in a single-ended topology or a differential topology. In higher order modulation schemes or OFDM, the PA in the transmitter front-end usually operates at much lower output power than its saturated peak power which is called as back-off operation. Therefore, the energy efficiency in the lower output powers (i.e. back-off operation) is a key metric in PA design. In current implementations of PAs, while the efficiency is good when transmitting symbols at the peak output power, it gets degraded significantly at back-off operation, since the PA actives are always in ON mode and the DC power gets wasted. In order to overcome the above disadvantages, a digital capability which effectively enhances the back-off energy efficiency and provides re-configurability for applications such as VSWR tuning is preferred. Therefore, a stacked differential amplifier circuit that utilizes digital operation to selectively activate or deactivate select segments of the stacked differential amplifier circuit is proposed in this disclosure, further details of which are given in embodiments below.

FIG. 1 illustrates an exemplary simplified block diagram of an on-chip transformer circuit 100, according to various embodiments described herein. The on-chip transformer circuit 100 comprises a primary winding circuit 102 and a secondary winding circuit 104 coupled to one another. In particular, in the embodiments described herein, the primary winding circuit 102 and the secondary winding circuit 104 are magnetically coupled to one another, and the term "coupled" is not to be construed to be limited to mean "directly coupled". In some embodiments, the primary winding circuit 102 comprises a primary feeding port 106 comprising two primary signal terminals configured to receive a primary input signal. In some embodiments, the primary feeding port 106 comprise a differential port configured to receive a differential input signal. In such embodiments, the primary input signal may comprise a differential input signal. However, in other embodiments, the primary feeding port 102 can comprise a single-ended input port configured to receive a single ended signal. In some embodiments, the secondary winding circuit 104 comprises a secondary feeding port 108 comprising two secondary signal terminals configured to provide a secondary output signal. In some embodiments, the secondary feeding port 108 comprise a differential port configured to provide a differential input signal. In such embodiments, the secondary output signal may comprise a differential output signal. However, in other embodiments, the secondary feeding port 108 can comprise a single-ended output port configured to provide a single ended signal.

In some embodiments, the primary winding circuit 102 may comprise at least one turn of a primary conductive winding arranged as a first N-sided polygon in a first dielectric layer of a substrate. In some embodiments, the primary conductive winding comprises a primary metal winding. In some embodiments, the primary feeding port 106 associated with the primary conductive winding is arranged on any one side of the first N-sided polygon. In some embodiments, the primary winding circuit 102 further comprises a primary center-tap port comprising a conductive connection coupled to a center point of the primary conductive winding with respect to the two primary signal terminals. In some embodiments, the primary center tap port is located in a third dielectric layer of the substrate and is coupled to the center point of the primary conductive winding via a plurality of vias. In some embodiments, the secondary winding circuit 104 comprises at least one turn of a secondary conductive winding arranged as a second N-sided polygon in a second, different, dielectric layer of the substrate. In some embodiments, the secondary conductive winding comprises a secondary metal winding. In some embodiments, the secondary feeding port 108 associated with the secondary conductive winding is arranged on any one side of the second N-sided polygon.

In some embodiments, the secondary winding circuit 104 further comprises a secondary center-tap port comprising a conductive connection (e.g., a metal connection) coupled to a center point of the secondary conductive winding with respect to the two secondary signal terminals. In some embodiments, the secondary center tap port is located in a fourth dielectric layer of the substrate and is coupled to the center point of the secondary conductive winding via a plurality of vias. In some embodiments, the third dielectric layer and the fourth dielectric layer are the same. In some embodiments, the first N-sided polygon and the second N-sided polygon may be equal-sided polygons or non-equal-sided polygons. In some embodiments, N can be any number greater than or equal to 4 (i.e., N>=4). In some embodiments, the number of turns associated with the primary conductive winding and the secondary conductive windings may be the same. However, in other embodiments, the number of turns associated with the primary conductive winding and the secondary conductive windings may be different (e.g., step-up transformer, step-down transformer etc.).

In some embodiments, the primary winding circuit 102 and the secondary winding circuit 104 are arranged to overlap one another at predetermined locations along the primary conductive winding and the secondary conductive winding. In some embodiments, the predetermined locations comprise a number of locations less than all locations along the primary conductive winding and the secondary conductive winding. In particular, in one embodiment, the primary winding circuit 102 and the secondary winding circuit 104 are configured to be identical to one another in shape and size, and the secondary winding circuit 104 is rotated with respect to the primary winding circuit 102 by a predefined rotation angle such that the primary winding circuit 102 and the secondary winding circuit 104 overlap at the predetermined locations along the primary conductive winding and the secondary conductive winding, further details of which are provided in an embodiment below. Further, in another embodiment, the secondary conductive winding associated with the secondary winding circuit 104 and the primary conductive winding associated with the primary winding circuit 102 are interleaved with respect to one another, at one or more respective sides, forming one or more interleaved sides, along the primary conductive winding and the secondary conductive winding such that the primary winding circuit and the secondary winding circuit overlap at the predetermined locations along the primary conductive winding and the secondary conductive winding, further details of which are given in an embodiment below.

Figure 2:
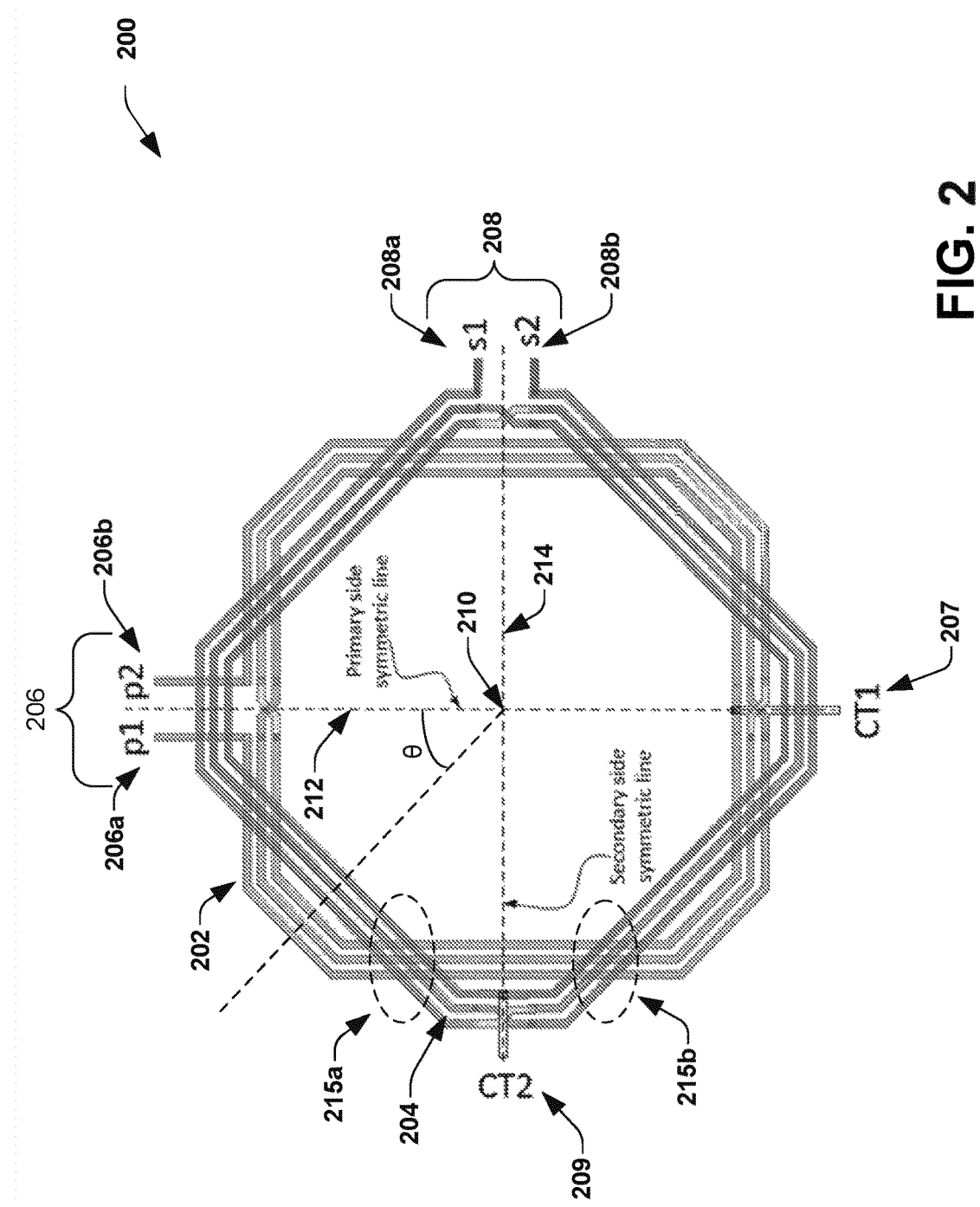
FIG. 2 illustrates an example implementation of an on-chip transformer circuit, according to one embodiment of the disclosure.

FIG. 2 illustrates an example implementation of an on-chip transformer circuit 200, according to one embodiment of the disclosure. In some embodiments, the on-chip transformer circuit 200 comprises one possible way of implementation of the on-chip transformer circuit 100 in FIG. 1. The on-chip transformer circuit 200 comprises a primary winding circuit 202 comprising 3 turns of a primary conductive winding (e.g., a metal winding) arranged in an octagon shape having 8 sides on a first dielectric layer of a substrate. However, in other embodiments, the primary winding circuit 202 can have any number of turns (more or less than 3) and can be arranged to have more or less than 8 sides (e.g., N sides). In this embodiment, the orthogonal sides have different length from the diagonal sides for each turn. However, in other embodiments, the length of each side of the polygon can be defined differently (e.g., equal sides or non-equal sides). The on-chip transformer circuit 200 further comprises a secondary winding circuit 204 comprising 3 turns of a secondary conductive winding (e.g., a metal winding) arranged in an octagon shape having 8 sides on a second, different dielectric layer of the substrate.

In some embodiments, the secondary winding circuit 204 is configured to be identical or substantially identical in shape and size to the primary winding circuit 202. However, in other embodiments, the secondary winding circuit 204 can have different dimensions, for example, length of each side can be different compared to the primary winding circuit 202. In some embodiments, the primary winding circuit 202 and the secondary winding circuit 204 are symmetrically arranged with respect to a common center point 210. In some embodiments, the secondary winding circuit 204 is rotated (clockwise or anti-clockwise) with respect to the primary winding circuit 202 by a predefined rotation angle θ such that the primary winding circuit 202 and the secondary winding circuit 204 overlap one another at predetermined locations (e.g., 215a, 215b etc.) along the primary conductive winding and the secondary conductive winding. In some embodiments, the predetermined locations comprises a number of locations that is less than all the available locations along the primary conductive winding and the secondary conductive winding. In some embodiments, the secondary winding circuit 204 is rotated with respect to the primary winding circuit 202 by the predefined rotation angle in reference to the common center point 210.

In this embodiment, the secondary conductive winding is shown to include the same number of turns as the primary winding circuit 202 (i.e., 3 turns). However, in other embodiments, the number of turns in the secondary conductive windings can be different from the primary winding circuit 202, In this embodiment, the predefined rotation angle comprises 45 degrees. However, in other embodiments, the rotation angle can be different. In some embodiments, the secondary winding circuit 204 is rotated with respect to the primary winding circuit 202 so as to optimize the coupling coefficient and the self-resonance frequency of the on-chip transformer circuit 200. In some embodiments, the length of each side of the primary winding circuit 202 and the secondary winding circuit 204 are chosen in a way to get optimal coupling coefficient and self-resonance frequency in the rotated position.

Figure 3A:
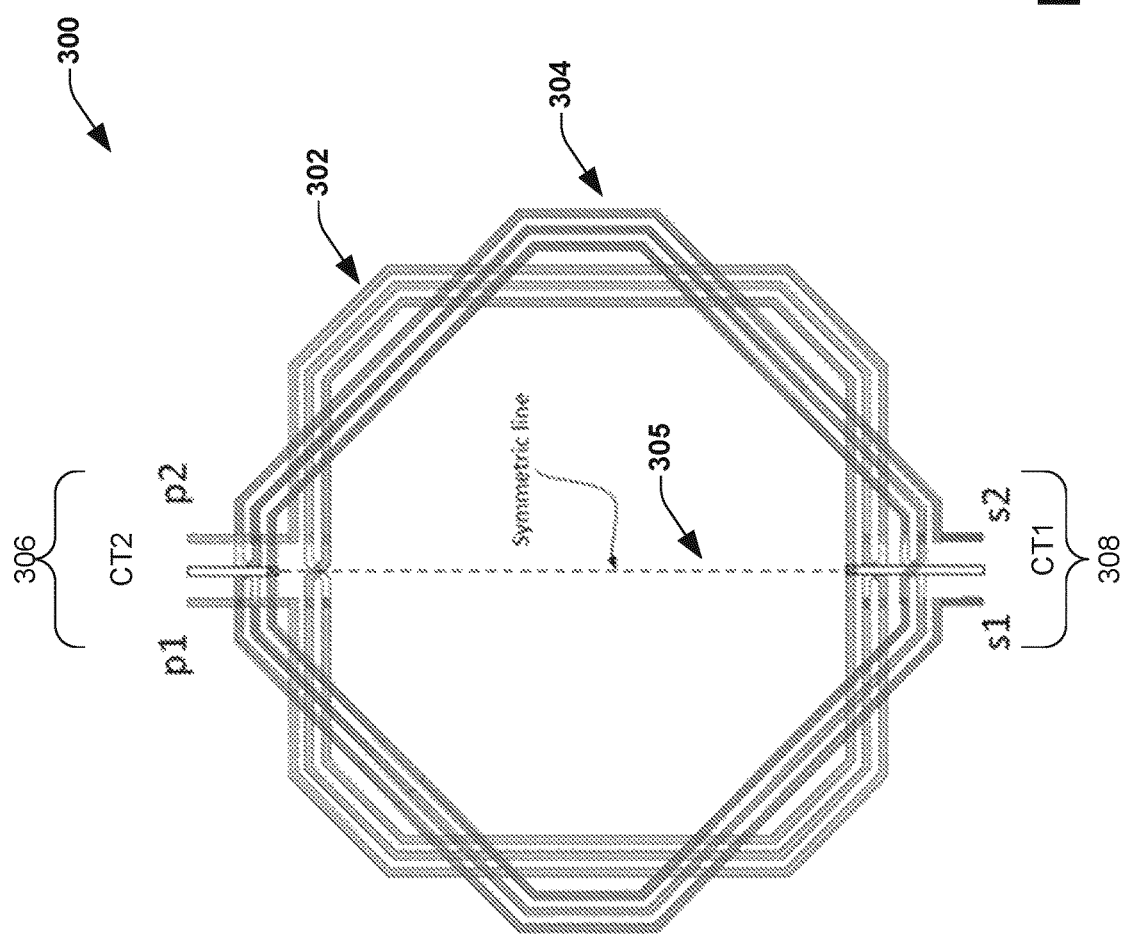
FIG. 3a depicts an on-chip transformer circuit comprising a primary winding circuit and a secondary winding circuit having a primary feeding port and a secondary feeding port arranged in diagonal directions with respect to one another.
Figure 3B:
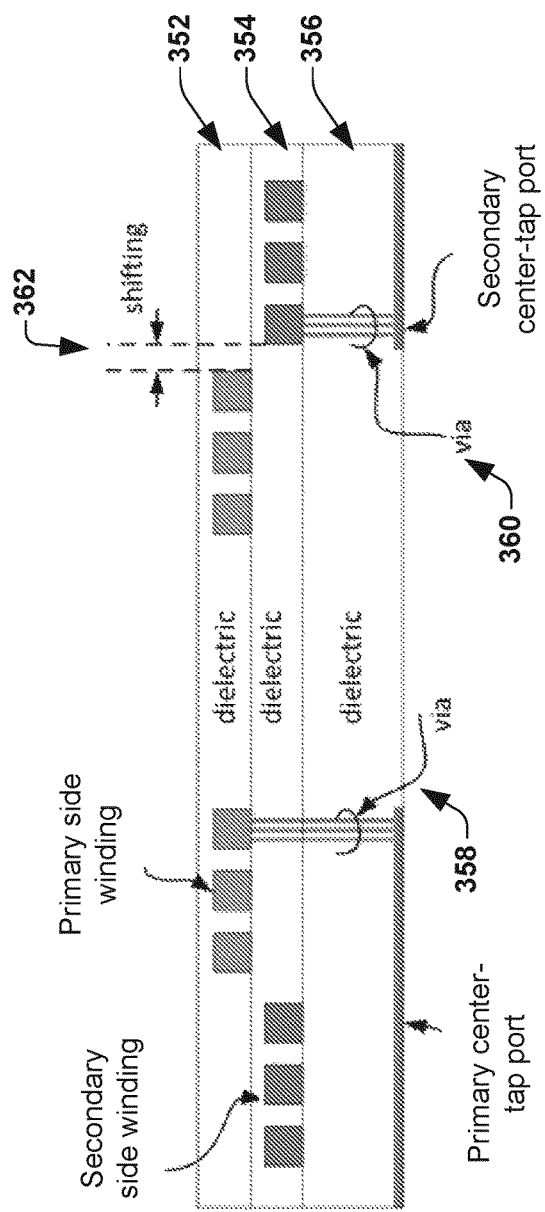
FIG. 3b illustrates a cross-section view of the on-chip transformer circuit, according to one embodiment of the disclosure.

In some embodiments, the primary winding circuit 202 comprises a primary feeding port 206 comprising a first primary signal terminal p1 206a and a second primary signal terminal p2 206b. In some embodiments, the primary winding circuit 202 further comprises a primary center-tap port CT1 207 comprising a conductive connection coupled to a center point of the primary conductive winding with respect to the two primary signal terminals 206a and 206b. In some embodiments, the primary center tap port CT1 207 is located in a third dielectric layer of the substrate and is coupled to the center point of the primary conductive winding via a plurality of vias, as shown in FIG. 3b. In some embodiments, the secondary winding circuit 204 comprises a secondary feeding port 208 comprising a first secondary signal terminal s1 208a and a second secondary signal terminal s2 208b. In some embodiments, the secondary winding circuit 204 further comprises a secondary center-tap port CT2 209 comprising a conductive connection (e.g., a metal connection) coupled to a center point of the secondary conductive winding with respect to the two secondary signal terminals 208a and 208b. In some embodiments, the secondary center tap port CT1 207 is located in the third dielectric layer of the substrate and is coupled to the center point of the secondary conductive winding via a plurality of vias, as shown in FIG. 3b.

In some embodiments, the secondary center tap port CT2 209 may be removed and one of the two secondary signal terminals, say S1 208a, may be coupled to AC ground electrically, so as to configure the on-chip transformer circuit 200 as a balun (balance-unbalance). In the balun mode, the on-chip transformer circuit 200 may be configured to convert a differential signal at the primary side to a single-ended signal at the secondary side. Alternately, in the balun mode, the on-chip transformer circuit 200 may be configured to convert a single-ended signal at the secondary side to a differential signal at the primary side. In some embodiments, the primary winding circuit 202 is arranged to be symmetric with respect to a primary center line 212 (also referred to as primary side symmetric line in some embodiments) comprising a straight line between the two primary terminals p1 and p2 of the primary feeding port 206 associated with the primary winding circuit 202 and passing through the common center point 210. Similarly, the secondary winding circuit 204 is arranged to be symmetric with respect to a secondary center line 214 (also referred to as secondary side symmetric line in some embodiments) comprising a straight line between the two secondary terminals s1 and s2 of the secondary feeding port 208 associated with the secondary winding circuit 204 and passing through the common center point 210.

In this embodiment, the primary feeding port 206 and the secondary feeding port 208 are arranged in orthogonal directions with respect to one another. However, in other embodiments, the primary feeding port 206 and the secondary feeding port 208 may be arranged in different orientations with respect to one another. For example, FIG. 3a depicts an on-chip transformer circuit 300 comprising a primary winding circuit 302 and a secondary winding circuit 304 having a primary feeding port 306 and a secondary feeding port 308 arranged in diagonal directions with respect to one another. Therefore, in this embodiment, the primary center line and the secondary center line overlap to form a symmetric line 305. All the other features of the on-chip transformer circuit 300 are similar to the on-chip transformer circuit 200 in FIG. 2 and is therefore all the explanations above with respect to FIG. 2 is also applicable to FIG. 3. Further, in other embodiments, the primary feeding port 206 and the secondary feeding port 208 of the on-chip transformer circuit 200 may be arranged in non-orthogonal or non-diagonal direction with respect to one another.

FIG. 3b illustrates a cross-section view of the on-chip transformer circuit 300 with respect to the symmetric line 305. In FIG. 3b, it can be seen that the primary conductive windings 302 are arranged in a dielectric layer 352 and the secondary conductive windings are arranged in a dielectric layer 354. Further, the primary conductive winding is shifted with respect to the secondary conducting winding by a shifting distance 362. Further, in FIG. 3b, it can be seen that the primary center-tap port CT1 is arranged in the dielectric layer 356 and coupled to center point of the primary conductive winding 302 using a plurality of vias 358. Similarly, the secondary center-tap port CT2 is arranged in the dielectric layer 356 and coupled to center point of the secondary conductive winding 304 using a plurality of vias 360. Although, the various dielectric layers 352, 354 and 356 are shown to be adjacent layers, in other embodiments, the dielectric layers 352, 354 and 356 may not be adjacent to one another. Also, the order in which the various windings are arranged in the various dielectric layers 352, 354 and 356 may be different. For example, in some embodiments, the primary winding circuit 302 may be arranged in the dielectric layer 354 and the secondary winding circuit 304 may be arranged in the dielectric layer 352.

Figure 4:
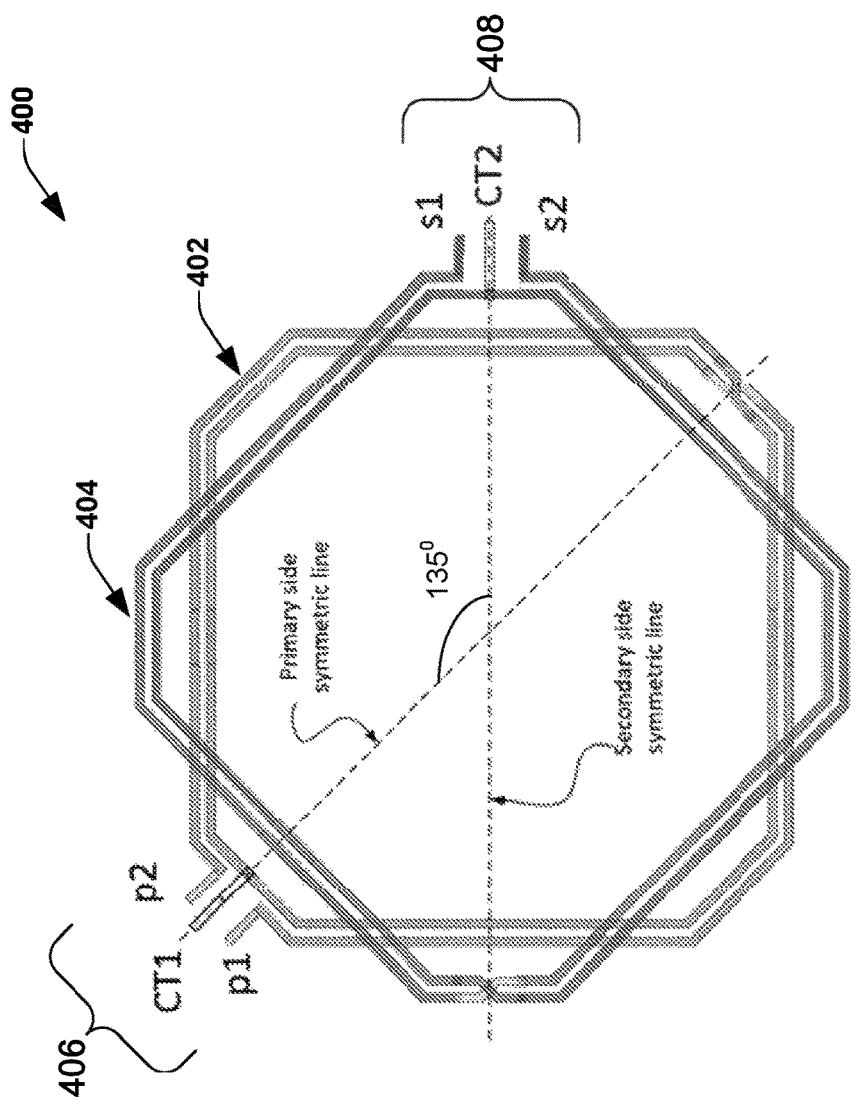
FIG. 4 illustrates another example implementation of an on-chip transformer circuit, according to one embodiment of the disclosure.

FIG. 4 illustrates another example implementation of an on-chip transformer circuit 400, according to one embodiment of the disclosure. In some embodiments, the on-chip transformer circuit 400 depicts another possible way of implementation of the on-chip transformer circuit 200 in FIG. 2. The on-chip transformer circuit 400 comprises a primary winding circuit 402 comprising a primary conductive winding having 2 turns arranged in the form of an octagon in a first dielectric layer of a substrate. The on-chip transformer circuit 400 further comprises a secondary winding circuit 404 comprising a secondary conductive winding having 2 turns arranged in the form of an octagon in a second, different, dielectric layer of a substrate. The primary winding circuit 402 comprises a primary feeding port 406 and the secondary winding circuit 404 comprises a secondary feeding port 408 arranged at 135 degrees with respect to one another. All the other features of the on-chip transformer circuit 400 are similar to the on-chip transformer circuit 200 in FIG. 2 and is therefore all the explanations above with respect to FIG. 2 is also applicable to FIG. 4.

Figure 5:
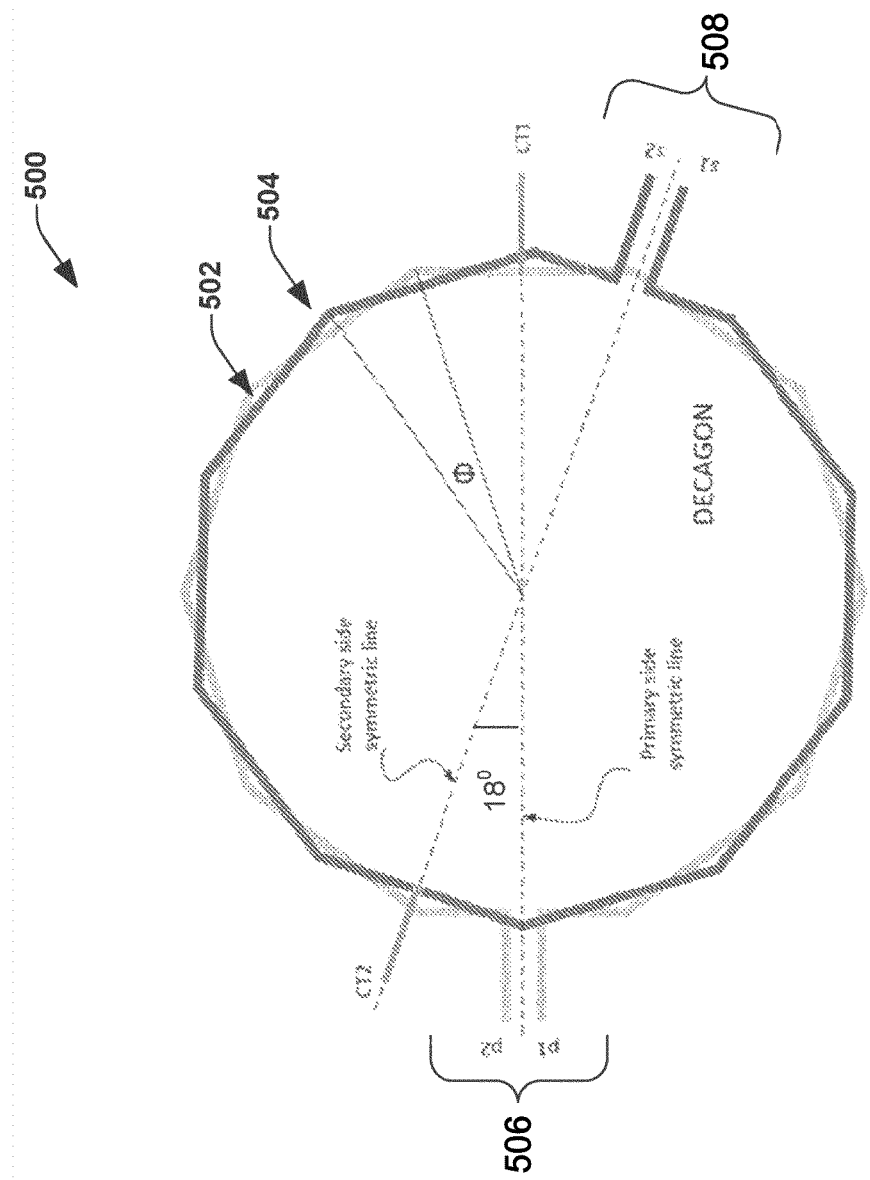
FIG. 5 illustrates another example implementation of an on-chip transformer circuit, according to one embodiment of the disclosure.

FIG. 5 illustrates another example implementation of an on-chip transformer circuit 500, according to one embodiment of the disclosure. In some embodiments, the on-chip transformer circuit 500 depicts another possible way of implementation of the on-chip transformer circuit 200 in FIG. 2. The on-chip transformer circuit 500 comprises a primary winding circuit 502 comprising a primary conductive winding having one single turn arranged in the form of a decagon (N=10) in a first dielectric layer of a substrate. The on-chip transformer circuit 500 further comprises a secondary winding circuit 504 comprising a secondary conductive winding having one single turn arranged in the form of a decagon in a second, different, dielectric layer of a substrate. The secondary winding circuit 504 is rotated with respect to the primary winding circuit 502 by 18 degrees. All the other features of the on-chip transformer circuit 500 are similar to the on-chip transformer circuit 200 in FIG. 2 and is therefore all the explanations above with respect to FIG. 2 is also applicable to FIG. 5.

Figure 6:
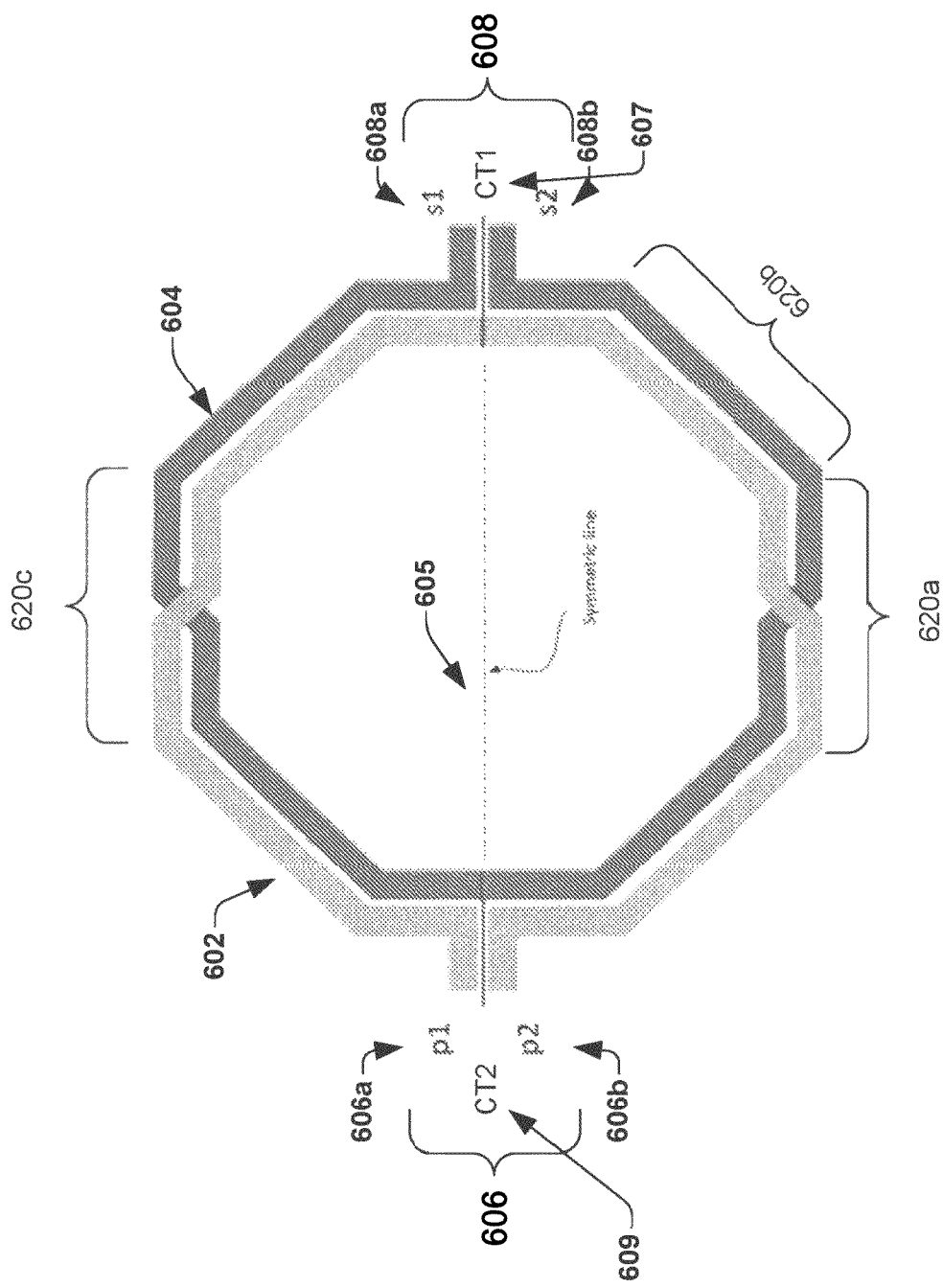
FIG. 6 illustrates an example implementation of an on-chip transformer circuit, according to one embodiment of the disclosure.

FIG. 6 illustrates an example implementation of an on-chip transformer circuit 600, according to one embodiment of the disclosure. In some embodiments, the on-chip transformer circuit 600 comprises another possible way of implementation of the on-chip transformer circuit 100 in FIG. 1. The on-chip transformer circuit 600 comprises a primary winding circuit 602 comprising one single turn of a primary conductive winding (e.g., a metal winding) arranged in an octagon shape having 8 sides on a first dielectric layer of a substrate. However, in other embodiments, the primary winding circuit 602 can have any number of turns and can be arranged to have more or less than 8 sides. In some embodiments, the primary winding circuit 602 comprises an equal-sides polygon, that is, all the sides of the polygon are equal in length (equal sided octagon, in this embodiment). However, in other embodiments, the length of each side of the polygon can be defined differently (e.g., equal sides or non-equal sides). The on-chip transformer circuit 600 further comprises a secondary winding circuit 604 comprising one single turn of a secondary conductive winding (e.g., a metal winding) arranged in an octagon shape having 8 sides on a second, different dielectric layer of the substrate. In this embodiment, the secondary conductive winding is shown to include the same number of turns as the primary winding circuit 202 (i.e., 1 turn). However, in other embodiments, the number of turns in the secondary conductive windings 604 can be different from the primary winding circuit 602.

In some embodiments, the primary winding circuit 602 comprises a primary feeding port 606 comprising a first primary signal terminal p1 606a and a second primary signal terminal p2 606b. In some embodiments, the primary winding circuit 602 further comprises a primary center-tap port CT1 607 comprising a conductive connection coupled to a center point of the primary conductive winding with respect to the two primary signal terminals 606a and 606b. In some embodiments, the primary center tap port CT1 607 is located in a third dielectric layer of the substrate and is coupled to the center point of the primary conductive winding via a plurality of vias. In some embodiments, the secondary winding circuit 604 comprises a secondary feeding port 608 comprising a first secondary signal terminal s1 608a and a second secondary signal terminal s2 608b. In some embodiments, the secondary winding circuit 604 further comprises a secondary center-tap port CT2 609 comprising a conductive connection (e.g., a metal connection) coupled to a center point of the secondary conductive winding with respect to the two secondary signal terminals 608a and 608b. In some embodiments, the secondary center tap port CT2 609 is located in the third dielectric layer of the substrate and is coupled to the center point of the secondary conductive winding via a plurality of vias. In some embodiments, the secondary center tap port CT2 609 may be removed and one of the two secondary signal terminals, say S1 608a, may be coupled to AC ground electrically, so as to configure the on-chip transformer circuit 600 as a balun (balance-unbalance). In the balun mode, the on-chip transformer circuit 600 may be configured to convert a differential signal at the primary side to a single-ended signal at the secondary side. Alternately, in the balun mode, the on-chip transformer circuit 600 may be configured to convert a single-ended signal at the secondary side to a differential signal at the primary side.

In some embodiments, the primary winding circuit 602 and the secondary winding circuit 604 are arranged to be symmetrical with respect to a center line 605 (also referred to as a symmetric line, in some embodiments). In some embodiments, the center line 605 passes through the middle of the two primary signal terminals p1 and p2 associated with the primary conductive winding, and the two secondary signal terminals s1 and s2 associated with the secondary conductive winding. In some embodiments, the two primary signal terminals and the two secondary terminals are arranged in opposite directions with respect to one another. In some embodiments, each side of the primary winding circuit 602 is symmetrically aligned with respect to a corresponding side of the secondary winding circuit 604, thereby forming 8 aligned sides (e.g., 620a, 620b etc.) of the on-chip transformer circuit 600. In other embodiments, wherein the primary winding circuit 602 and the secondary winding circuit 604 comprise N sides, N sides of the primary winding circuit 602 may be symmetrically aligned with respect to N corresponding sides of the secondary winding circuit 604, thereby forming N aligned sides (e.g., 620a, 620b etc.) of the on-chip transformer circuit 600. In some embodiments, the term symmetrically aligned can be construed to mean that there is a symmetry in terms of length of each side of the primary conductive winding to the length of a corresponding side of the secondary conductive winding, or there is a symmetry in terms of a distance between each side of the primary conductive winding to a corresponding side of the secondary conductive winding, or both.

In this embodiment, the secondary conductive winding associated with the secondary winding circuit 604 and the primary conductive winding associated with the primary winding circuit 602 are interleaved with respect to one another, at 2 aligned sides 620a and 620c, thereby forming 2 interleaved sides. However, in other embodiments, the secondary conductive winding associated with the secondary winding circuit 604 and the primary conductive winding associated with the primary winding circuit 602 are interleaved with respect to one another, at one or more respective sides, forming one or more interleaved sides, along the primary conductive winding and the secondary conductive winding, such that the primary winding circuit 602 and the secondary winding circuit 604 overlap one another at predetermined locations along the primary conductive winding and the secondary conductive winding. In some embodiments, the predetermined locations comprises a number of locations that is less than all the available locations along the primary conductive winding and the secondary conductive winding. In some embodiments, the usage that the primary conductive winding and the secondary conductive winding interleave with respect to one another may be construed to mean that the primary conductive winding and the secondary conductive winding cross over one another. In some embodiments, the one or more interleaved sides can comprise one or more of the aligned sides associated with the on-chip transformer circuit 600, except the aligned sides comprising the primary feeding port 606 and the secondary feeding port 608 (i.e., up to N−2 interleaved sides, if there are N aligned sides in total). In some embodiments, the one or more interleaved sides comprises at least one side pair comprising two aligned sides that are mirrored about the center line, as is the case in FIG. 6. Alternately, in some embodiments, the one or more interleaved sides comprises every aligned side except the aligned sides comprising the primary feeding port 606 and the secondary feeding port 608.

Figure 7:
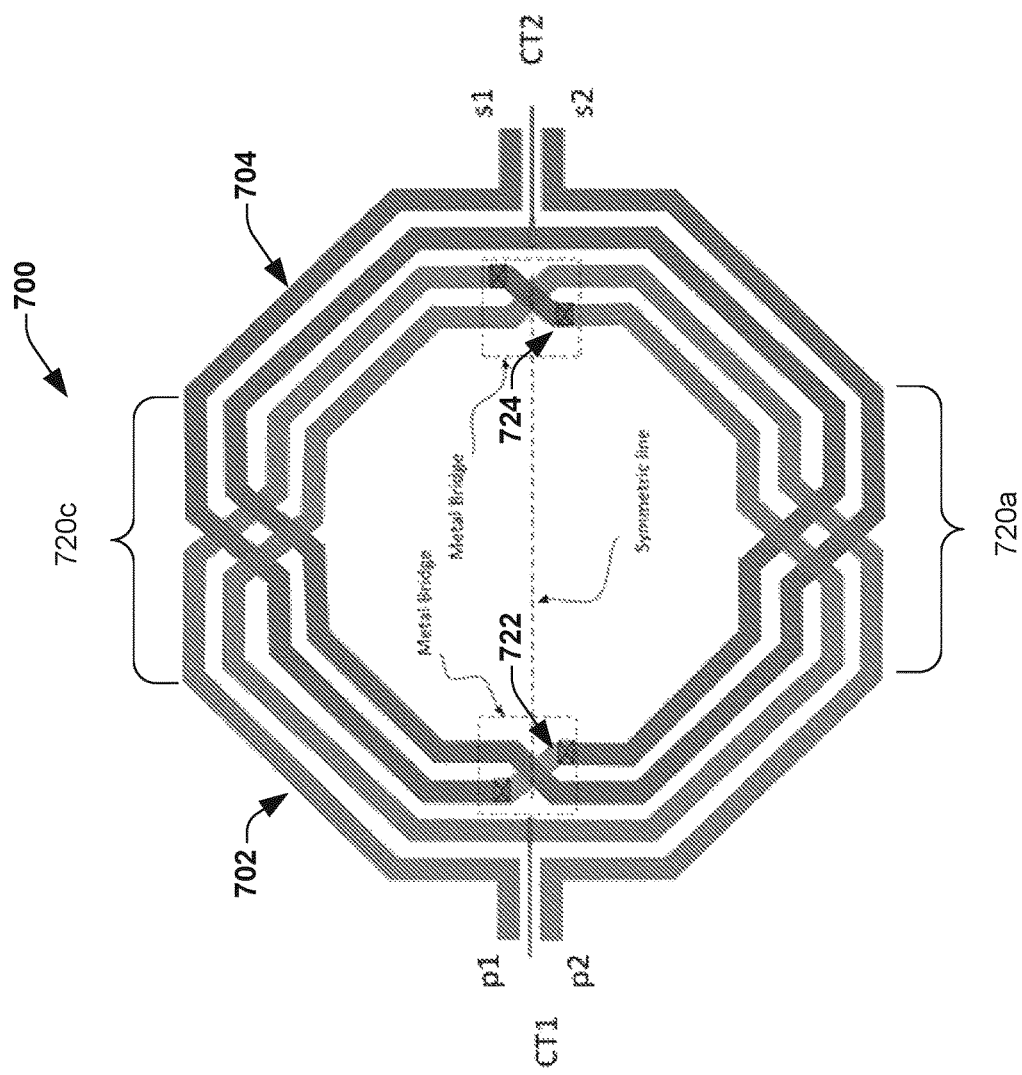
FIG. 7 illustrates an example implementation of an on-chip transformer circuit, according to one embodiment of the disclosure.

FIG. 7 illustrates another example implementation of an on-chip transformer circuit 700, according to one embodiment of the disclosure. In some embodiments, the on-chip transformer circuit 700 depicts another possible way of implementation of the on-chip transformer circuit 600 in FIG. 6. The on-chip transformer circuit 700 comprises a primary winding circuit 702 comprising two turns of a primary conductive winding (e.g., a metal winding) arranged in an equal-sided octagon shape having 8 sides on a first dielectric layer of a substrate. The on-chip transformer circuit 700 further comprises a secondary winding circuit 704 comprising two turns of a secondary conductive winding (e.g., a metal winding) arranged in an equal-sided octagon shape having 8 sides on a second, different dielectric layer of the substrate. Each side of the primary winding circuit 702 is symmetrically aligned with respect to a corresponding side of the secondary winding circuit 704 to form a plurality of aligned sides, for example, 720a, 720c etc. In this embodiment, the secondary conductive winding associated with the secondary winding circuit 704 and the primary conductive winding associated with the primary winding circuit 702 are interleaved with respect to one another, at 2 aligned sides 720a and 720c, thereby forming 2 interleaved sides.

In embodiments where the primary winding circuit 702 or the secondary winding circuit 704 have multiple turns, each turn associated with the primary winding circuit 702 is interleaved (or overlapped) with each turn of the secondary winding circuit 704 at the interleaved sides. For example, on the interleaved side 720a, each turn associated with the primary winding circuit 702 is interleaved (or overlapped) with each turn of the secondary winding circuit 704 at the interleaved sides. In some embodiments, the primary winding circuit 702 further comprises a metal bridge 722 configured to couple the two turns of the primary conductive winding in a series pattern, in order to have larger inductance. Similarly, the secondary winding circuit 704 further comprises a metal bridge 724 configured to couple the two turns of the secondary conductive winding in a series pattern, in order to have larger inductance. All the other features of the on-chip transformer circuit 700 are similar to the on-chip transformer circuit 600 in FIG. 6 and is therefore all the explanations above with respect to FIG. 6 is also applicable to FIG. 7.

Figure 8:
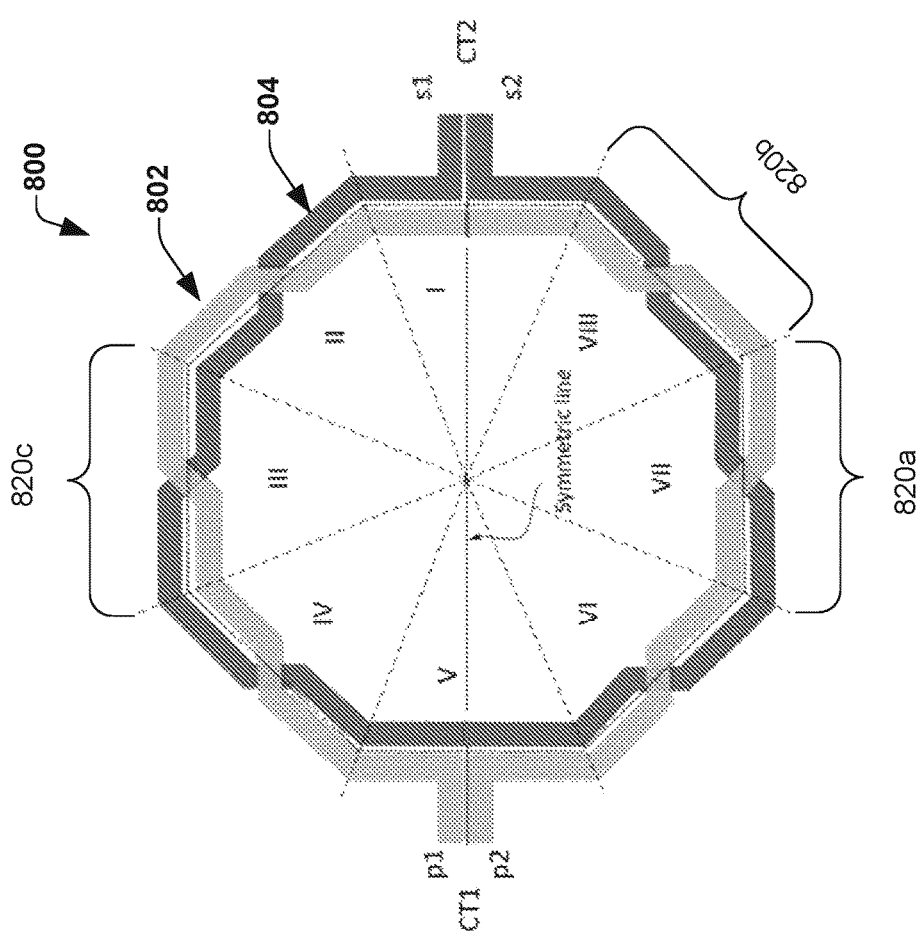
FIG. 8 illustrates an example implementation of an on-chip transformer circuit, according to one embodiment of the disclosure.

FIG. 8 illustrates another example implementation of an on-chip transformer circuit 800, according to one embodiment of the disclosure. In some embodiments, the on-chip transformer circuit 800 depicts another possible way of implementation of the on-chip transformer circuit 600 in FIG. 6. The on-chip transformer circuit 800 comprises a primary winding circuit 802 comprising one single turn of a primary conductive winding (e.g., a metal winding) arranged in an equal-sided octagon shape having 8 sides on a first dielectric layer of a substrate. The on-chip transformer circuit 800 further comprises a secondary winding circuit 804 comprising one single turn of a secondary conductive winding (e.g., a metal winding) arranged in an equal-sided octagon shape having 8 sides on a second, different dielectric layer of the substrate, Each side of the primary winding circuit 802 is symmetrically aligned with respect to a corresponding side of the secondary winding circuit 804 to form 8 aligned sides, for example, 820a, 820b, 820c etc. In this embodiment, the secondary conductive winding associated with the secondary winding circuit 804 and the primary conductive winding associated with the primary winding circuit 802 are interleaved with respect to one another, at 6 aligned sides 820a, 820b, 820c etc., thereby forming 6 interleaved sides (i.e., N–2). In some embodiments, the 6 interleaved sides comprise all the aligned sides of the on-chip transformer circuit 800 except the aligned sides comprising the primary feeding port and the secondary feeding port. All the other features of the on-chip transformer circuit 800 are similar to the on-chip transformer circuit 600 in FIG. 6 and is therefore all the explanations above with respect to FIG. 6 is also applicable to FIG. 8.

Figure 9:
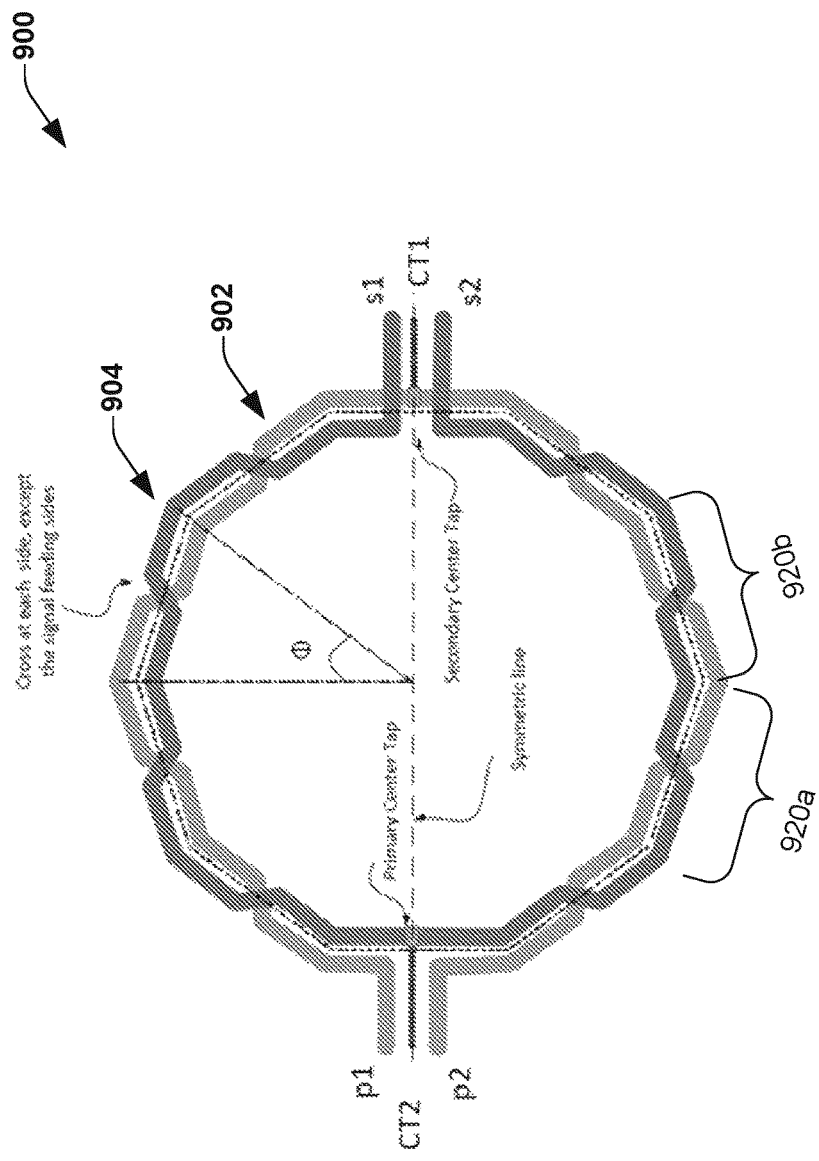
FIG. 9 illustrates an example implementation of an on-chip transformer circuit, according to one embodiment of the disclosure.

FIG. 9 illustrates another example implementation of an on-chip transformer circuit 900, according to one embodiment of the disclosure. In some embodiments, the on-chip transformer circuit 900 depicts another possible way of implementation of the on-chip transformer circuit 600 in FIG. 6. The on-chip transformer circuit 900 comprises a primary winding circuit 902 comprising one single turn of a primary conductive winding (e.g., a metal winding) arranged in an equal-sided decagon shape having 10 sides on a first dielectric layer of a substrate. The on-chip transformer circuit 900 further comprises a secondary winding circuit 904 comprising one single turn of a secondary conductive winding (e.g., a metal winding) arranged in an equal-sided decagon shape having 10 sides on a second, different dielectric layer of the substrate. Each side of the primary winding circuit 902 is symmetrically aligned with respect to a corresponding side of the secondary winding circuit 904 to form 10 aligned sides, for example, 920a, 920b etc. In this embodiment, the secondary conductive winding associated with the secondary winding circuit 904 and the primary conductive winding associated with the primary winding circuit 902 are interleaved with respect to one another, at 8 aligned sides, thereby forming 8 interleaved sides (i.e., N–2). In some embodiments, the 8 interleaved sides comprise all the aligned sides of the on-chip transformer circuit 900 except the aligned sides comprising the primary feeding port and the secondary feeding port. All the other features of the on-chip transformer circuit 900 are similar to the on-chip transformer circuit 600 in FIG. 6 and is therefore all the explanations above with respect to FIG. 6 is also applicable to FIG. 9.

Figure 10:
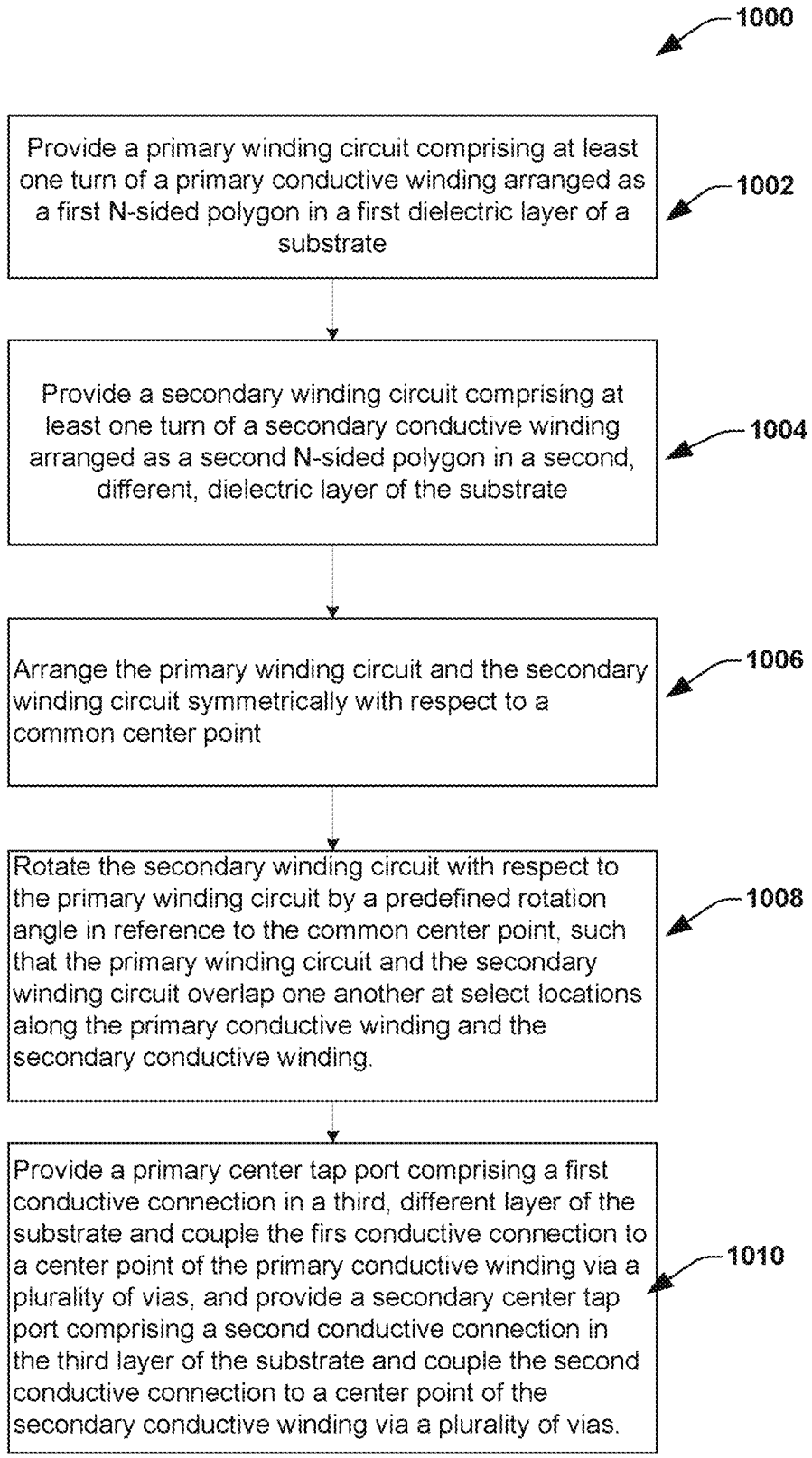
FIG. 10 illustrates a flow chart of a method for an on-chip transformer circuit, according to one embodiment of the disclosure.

FIG. 10 illustrates a flow chart of a method 1000 for an on-chip transformer circuit, according to one embodiment of the disclosure. The method 1000 is explained herein with reference to the on-chip transformer circuit 100 in FIG. 1 and the on-chip transformer circuit 200 in FIG. 2. At 1002, a primary winding circuit (e.g., the primary winding circuit 202 in FIG. 2) comprising at least one turn of a primary conductive winding arranged as a first N-sided polygon is provided in a first dielectric layer of a substrate. At 1004, a secondary winding circuit (e.g., the secondary winding circuit 204 in FIG. 2) comprising at least one turn of a secondary conductive winding arranged as a second N-sided polygon is provided in a second, different, dielectric layer of the substrate. In some embodiments, the secondary winding circuit and the primary winding circuit are identical in shape and size. At 1006, the primary winding circuit and the secondary winding circuit are arranged symmetrically with respect to a common center point (e.g., the common center point 210 in FIG. 2).

In some embodiments, the primary winding circuit is arranged to be symmetric with respect to a primary center line (e.g., the primary center line 212 in FIG. 2) comprising a straight line between the two primary terminals of a primary feeding port associated with the primary winding circuit and the secondary winding circuit is arranged to be symmetric with respect to a secondary center line (e.g., the secondary center line in FIG. 2) comprising a straight line between the two secondary terminals of the secondary feeding port associated with the secondary winding circuit, wherein the primary center line and the secondary center line passes through the common center point. At 1008, the secondary winding circuit is rotated with respect to the primary winding circuit by a predefined rotation angle (e.g., the predefined rotation angle θ in FIG. 2) in reference to the common center point, such that the primary winding circuit and the secondary winding circuit overlap one another at predetermined locations along the primary conductive winding and the secondary conductive winding. At 1010, a primary center tap port (e.g., the primary center tap port 207 in FIG. 2) comprising a first conductive connection is provided in a third, different layer of the substrate and the first conductive connection is coupled to a center point of the primary conductive winding via a plurality of vias, and a secondary center tap port (e.g., the secondary center tap port 209 in FIG. 2) comprising a second conductive connection is provided in the third layer of the substrate and the second conductive connection is coupled to a center point of the secondary conductive winding via a plurality of vias.

Figure 11:
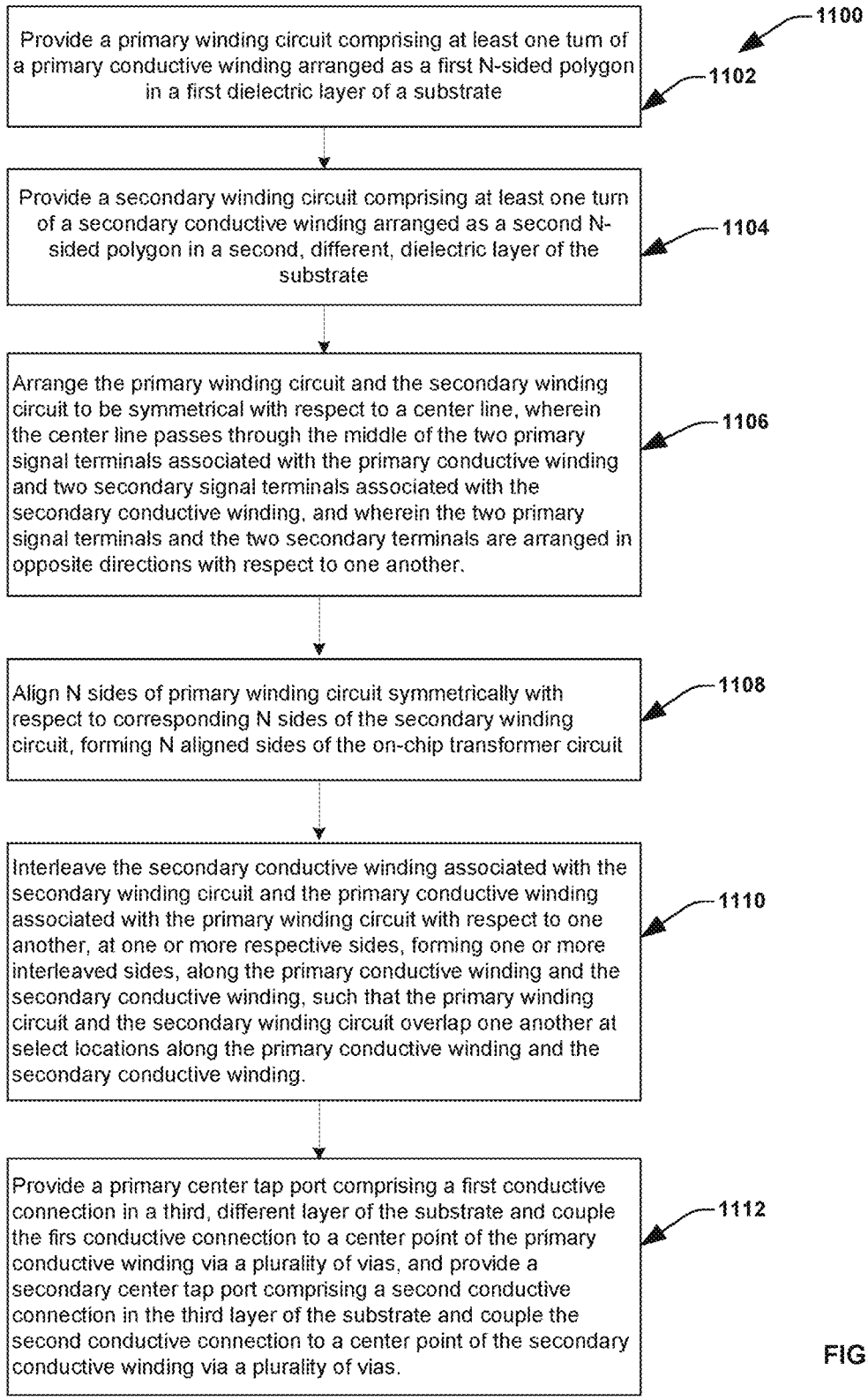
FIG. 11 illustrates a flow chart of a method for an on-chip transformer circuit, according to one embodiment of the disclosure.

FIG. 11 illustrates a flow chart of a method 1100 for an on-chip transformer circuit, according to one embodiment of the disclosure. The method 1100 is explained herein with reference to the on-chip transformer circuit 100 in FIG. 1 and the on-chip transformer circuit 600 in FIG. 6. At 1102, a primary winding circuit (e.g., the primary winding circuit 602 in FIG. 6) comprising at least one turn of a primary conductive winding arranged as a first N-sided polygon is provided in a first dielectric layer of a substrate. At 1104, a secondary winding circuit (e.g., the secondary winding circuit 604 in FIG. 6) comprising at least one turn of a secondary conductive winding arranged as a second N-sided polygon is provided in a second, different, dielectric layer of the substrate is provided. At 1106, the primary winding circuit and the secondary winding circuit are arranged to be symmetrical with respect to a center line (e.g., the center line 605 in FIG. 6). In some embodiments, the center line comprises a straight line that passes through the middle of the two primary signal terminals (p1, p2 in FIG. 6) associated with the primary conductive winding and two secondary signal terminals (s1, s2 in FIG. 6) associated with the secondary conductive winding. In some embodiments, the two primary signal terminals and the two secondary terminals are arranged in opposite directions with respect to one another.

At 1108, N sides of primary winding circuit aligned symmetrically with respect to corresponding N sides of the secondary winding circuit, forming N aligned sides (e.g., aligned sides 620a, 620b etc. in FIG. 6) of the on-chip transformer circuit. At 1110, the secondary conductive winding associated with the secondary winding circuit and the primary conductive winding associated with the primary winding circuit are interleaved or overlapped with respect to one another, at one or more respective sides, forming one or more interleaved sides, along the primary conductive winding and the secondary conductive winding, such that the primary winding circuit and the secondary winding circuit overlap one another at predetermined locations along the primary conductive winding and the secondary conductive winding. In some embodiments, the one or more interleaved sides can comprise one or more of the aligned sides associated with the on-chip transformer circuit, except the aligned sides comprising the primary feeding port and the secondary feeding port (i.e., up to N−2 interleaved sides, if there are N aligned sides in total). In some embodiments, the one or more interleaved sides comprises at least one side pair comprising two aligned sides that are mirrored about the center line. Alternately, in some embodiments, the one or more interleaved sides comprises every aligned side except the aligned sides comprising the primary feeding port and the secondary feeding port. At 1110, a primary center tap port (e.g., the primary center tap port 607 in FIG. 6) comprising a first conductive connection is provided in a third, different layer of the substrate and the first conductive connection is coupled to a center point of the primary conductive winding via a plurality of vias, and a secondary center tap port (e.g., the secondary center tap port 609 in FIG. 6) comprising a second conductive connection is provided in the third layer of the substrate and the second conductive connection is coupled to a center point of the secondary conductive winding via a plurality of vias.

Figure 12:
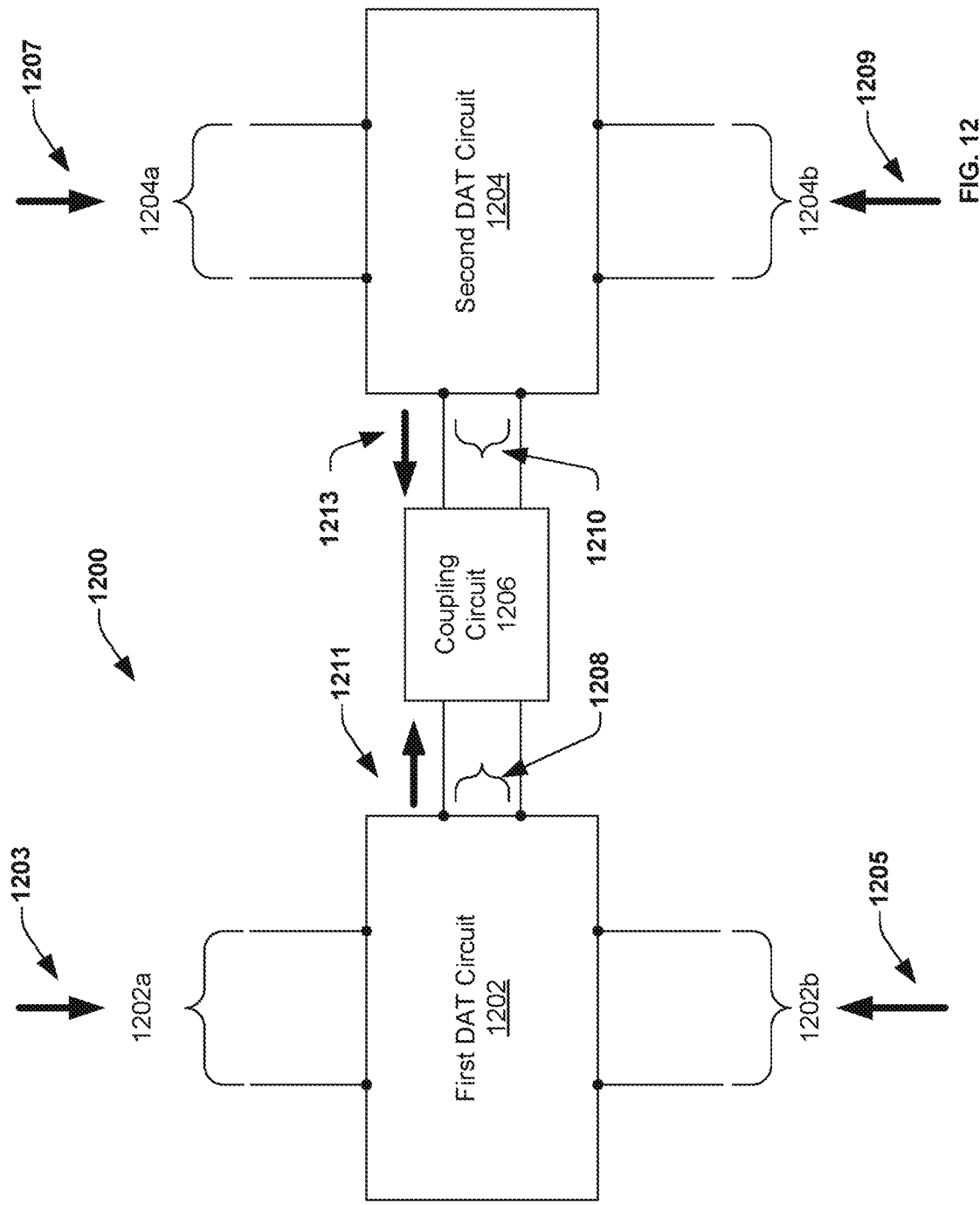
FIG. 12 depicts a simplified block diagram of a distributed active transformer (DAT) power combiner circuit, according to one embodiment of the disclosure.

FIG. 12 depicts a simplified block diagram of a distributed active transformer (DAT) power combiner circuit 1200, according to one embodiment of the disclosure. In some embodiments, the DAT power combiner circuit 1200 is utilized to combine power associated with a plurality of input signals from a plurality of devices, for example, power amplifiers. The DAT power combiner circuit 1200 comprises a first DAT circuit 1202 and a second DAT circuit 1204. In some embodiments, the first DAT circuit 1202 comprises a first input port 1202a and a second input port 1202b configured to receive a first input signal 1203 and a second input signal 1205, respectively. In some embodiments, the first DAT circuit 1202 may comprise a first primary winding circuit (not shown) comprising the first input port 1202a and the second input port 1202b, further details of which are provided in an embodiment below. In some embodiments, the first DAT circuit 1202 further comprises a first output port 1208 configured to provide a first output signal 1211. In some embodiments, the first DAT circuit 1202 may further comprise a first secondary winding circuit (not shown) comprising the first output port 1208, further details of which are provided in an embodiment below. In some embodiments, the first output signal 1211 is generated based on the first input signal 1203 and the second input signal 1205. In this embodiment, the first DAT circuit 1202 is depicted as a 2:1 power combiner configured to combine 2 input signals (i.e., 1203 and 1205 in this case) and generate a first output signal (i.e., 1211) based thereon. However, in other embodiments, the first DAT circuit 1202 may be configured to combine more than 2 input signals. In such embodiments, the first DAT circuit 1202 may comprise more than 2 input ports. In other words, in some embodiments, the first DAT circuit 1202 may comprise at least two input ports configured to receive at least two input signals, respectively associated therewith.

In some embodiments, the first input port 1202a and the second input port 1202b comprise differential input ports. In such embodiments, the first input signal 1203 and the second input signal 1205 comprise differential input signals. In some embodiments, the first output port 1208 comprises a differential output port. In such embodiments, the first output signal 1211 comprises a differential output signal.

In some embodiments, the second DAT circuit 1204 comprises a third input port 1204a and a fourth input port 1204b configured to receive a third input signal 1207 and a fourth input signal 1209, respectively. In some embodiments, the second DAT circuit 1204 may comprise a second primary winding circuit (not shown) comprising the third input port 1204a and the fourth input port 1204b, further details of which are provided in an embodiment below. In some embodiments, the second DAT circuit 1204 further comprises a second output port 1210 configured to provide a second output signal 1213. In some embodiments, the second DAT circuit 1204 may further comprise a second secondary winding circuit (not shown) comprising the second output port 1210, further details of which are provided in an embodiment below. In some embodiments, the second output signal 1213 is generated based on the third input signal 1207 and the fourth input signal 1209. In this embodiment, the second DAT circuit 1204 is depicted as a 2:1 power combiner configured to combine 2 input signals (i.e., 1207 and 1209 in this case) and generate an output signal (i.e., 1213) based thereon. However, in other embodiments, the second DAT circuit 1204 may be configured to combine more than 2 input signals. In such embodiments, the second DAT circuit 1204 may comprise more than 2 input ports. In other words, in some embodiments, the second DAT circuit 1204 may comprise at least two input ports configured to receive at least two input signals, respectively associated therewith.

In some embodiments, the third input port 1204a and the fourth input port 1204b comprise differential input ports. In such embodiments, the third input signal 1207 and the fourth input signal 1209 comprise differential input signals. In some embodiments, the second output port 1210 comprises a differential output port. In such embodiments, the second output signal 1213 comprises a differential output signal.

In some embodiments, the first output port 1208 of the first DAT circuit 1202 and the second output port 1210 of the second DAT circuit 1204 are electrically connected to one another. In some embodiments, the first output port 1208 of the first DAT circuit 1202 and the second output port 1210 of the second DAT circuit 1204 are electrically connected to one another at a coupling circuit 1206 (e.g., at a common node associated therewith). In some embodiments, the coupling circuit 1206 is implemented as a part of the DAT power combiner circuit 1200. However, in other embodiments, the coupling circuit 1206 is implemented as a component external to the DAT power combiner circuit 1200. In some embodiments, the coupling circuit 1206 comprises a radio frequency (RF) pad configured to be coupled to a load circuit. Alternately, in other embodiments, the coupling circuit 1206 comprises a load circuit. In some embodiments, the first output port 1208 of the first DAT circuit 1202 and the second output port 1210 of the second DAT circuit 1204 are configured to couple to the coupling circuit 1206 from opposite directions of the coupling circuit. In such embodiments, the coupling circuit 1206 is physically located between the first DAT circuit 1202 and the second DAT circuit 1204. In some embodiments, the first DAT circuit 1202 and the second DAT circuit 1204 are physically arranged in a way that the first output port 1208 of the first DAT circuit 1202 and the second output port 1210 of the second DAT circuit 1204 face one another from opposite directions. In some embodiments, such an arrangement enables the first DAT circuit 1202 and the second DAT circuit 1204 to couple to the coupling circuit 1206 from a minimum distance from the opposite ends. In some embodiments, reducing the distance between the output ports (i.e., 1208, 1210) and the coupling circuit 1206, reduces the loss associated with the extra leads connecting the output ports to the coupling circuit 1206, thereby further reducing the insertion loss of the DAT power combiner circuit 1200.

Figure 13:
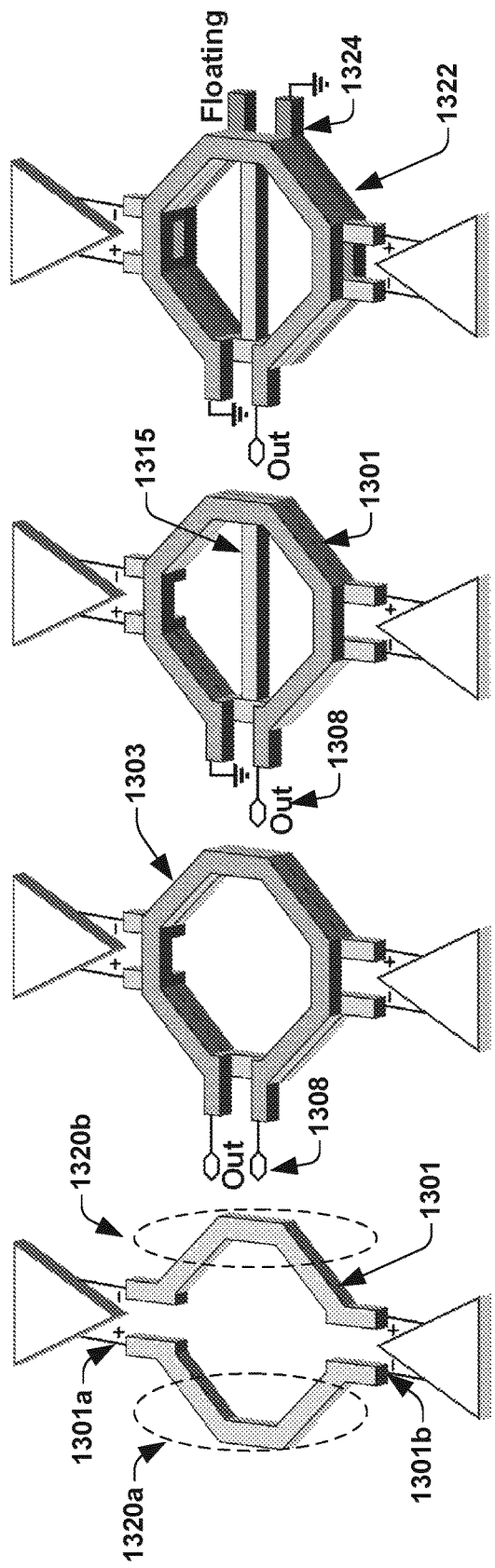
FIGS. 13a-13d depicts an example implementation of a first DAT circuit, according to one embodiment of the disclosure.

In some embodiments, the first DAT circuit 1202 may be implemented as explained in FIGS. 13a-13d, In some embodiments, the first DAT circuit 1202 comprises a primary winding circuit 1301 comprising a primary conductive loop (e.g., metal winding) comprising a first input port 1301a (analogous to the first input port 1202a in FIG. 12) configured to receive a first input signal and a second input port 1301b (analogous to the second input port 1202b in FIG. 12) configured to receive a second input signal, as shown in FIG. 13a. In some embodiments, the first input signal and the second input signal comprise differential signals. In this embodiment, the first input port 1301a is shown to receive the first input signal from a first differential power amplifier and the second input port 1301b is shown to receive the second input signal from a second differential amplifier. However, in other embodiments, the first input port 1301a may be configured to receive the first input signal and the second input port 1301b may be configured to receive the second input signal from other differential devices that are different from differential amplifiers. In some embodiments, the primary conductive loop comprises a first segment 1320a coupled between the first input port 1301a and the second input port 1301b, and a second segment 1320b coupled between the first input port 1301a and the second input port 1301b. In some embodiments, the primary winding circuit 1301 may comprise more than 2 input ports, as explained above with respect to FIG. 12. Referring back to FIG. 12, in some embodiments, the first DAT circuit 1202 further comprises a secondary winding circuit 1303 arranged next to the primary winding circuit 1301. In some embodiments, the secondary winding circuit 1303 comprises a secondary conductive loop (e.g., metal winding) comprising a first output port 1308 (analogous to the first output port 1208 in FIG. 12) configured to provide a first output signal, based on the first input signal and the second input signal, as shown in FIG. 13b. In some embodiments, the first output port 1308 comprises a differential output port, as shown in FIG. 13b. However, in other embodiments, the first output port 1308 comprises a single-ended output port (with one of the terminals grounded), as shown in FIG. 13c. By making the secondary single-ended which is the most common real case, in some embodiments, a huge imbalance is created between the impedances seen from each of the first input port 1301a and the second input port 1301b.

In some embodiments, when the primary winding circuit 1301 comprises 2 input ports (as is the case here), the primary winding circuit 1301 further comprises a conductive line 1315 (e.g., a metal conductor or winding) having a first end and a second, different end. In some embodiments, the first end of the conductive line 1315 is coupled to the first segment 1320a (e.g., a center point associated therewith) of the first primary conductive loop coupled between the first input port 1301a and the second input port 1301b, and the second end of the conductive line 1315 is coupled to a second, different, segment 1320b (e.g., a center point associated therewith) of the first primary conductive loop coupled between the first input port 1301a and the second input port 1301b. In some embodiments, the conductive line 1315 forces the centers of the two segments 1320a and 1320b to have the same potential and thereby improve the imbalance due to an asymmetry on the capacitive coupling between the primary winding circuit 1301 and secondary winding circuit 1303.

Referring back to FIG. 12, in some embodiments, the first DAT circuit 1202 further comprises a dummy winding circuit 1322 comprising a dummy conductive loop (e.g., a metal loop) having a dummy port 1324 comprising a first dummy terminal that is grounded and a second, different, dummy terminal that is floating. In some embodiments, the dummy winding circuit 1322 is physically arranged next to the primary winding circuit 1301 in a way that the primary conductive loop is located between the first secondary conductive loop and the first dummy conductive loop. In some embodiments, the dummy winding circuit 1322 is also provided to compensate for the imbalance between the primary winding circuit 1301 and the secondary winding circuit 1303 indicated above. In some embodiments, the dummy winding circuit 1322 enables to replicate the voltage swing across the first output port 1308 and ground, along the length of the secondary conductive loop with decreasing the amplitude (in a reverse direction) and therefore, the electric coupling across the inter-winding capacitance is equalized. Therefore, in some embodiments, the dummy winding circuit 1320 minimizes the port imbalance and insertion loss of the first DAT circuit 1202. In some embodiments, the second DAT circuit 1204 in FIG. 12 is also implemented in the same way as explained above with respect to the first DAT circuit 1202 in FIG. 12.

Figure 14:
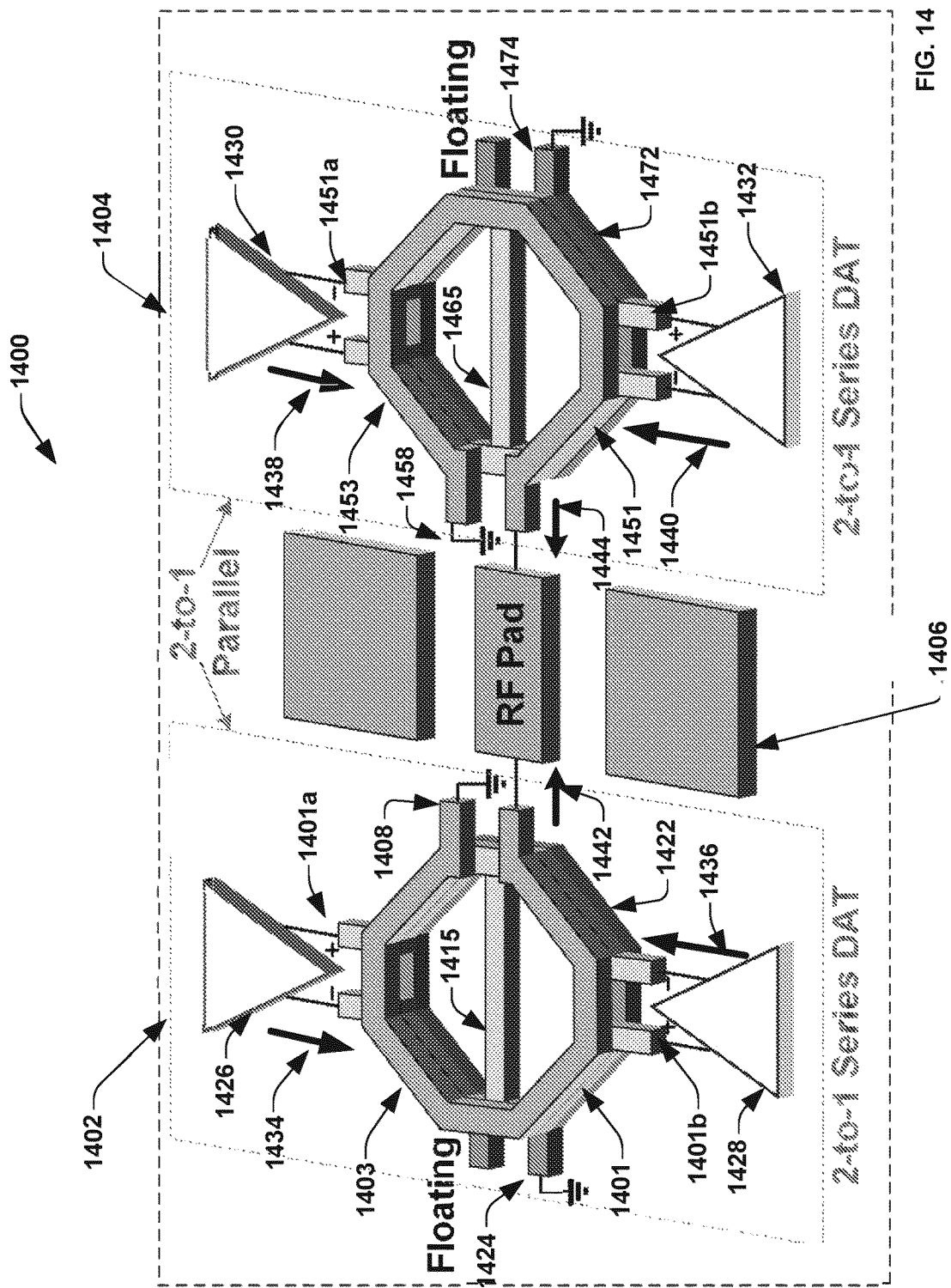
FIG. 14 depicts an example implementation of a distributed active transformer (DAT) power combiner circuit, according to one embodiment of the disclosure.

FIG. 14 depicts an example implementation of a distributed active transformer (DAT) power combiner circuit 1400, according to one embodiment of the disclosure. In some embodiments, the DAT power combiner circuit 1400 depicts one possible way of implementation of the DAT power combiner circuit 1200 in FIG. 12. The DAT power combiner circuit 1400 comprises a first DAT circuit 1402 and a second DAT circuit 1404. In some embodiments, the first DAT circuit 1402 comprises a first primary winding circuit 1401 comprising a first primary conductive loop (e.g., metal winding) comprising a first input port 1401*a* configured to receive a first input signal 1434 and a second input port 1401*b* configured to receive a second input signal 1436. In some embodiments, the first input port 1401*a* and the second input port 1401*b* are located at diagonally opposite directions with respect to one another along the first primary conductive loop. Alternately, in other embodiments, the first input port 1401*a* and the second input port 1401*b* may be arranged differently. In some embodiments, the first input signal 1434 and the second input signal 1436 comprise differential signals.

In this embodiment, the first input port 1401*a* is shown to receive the first input signal 1434 from a first differential power amplifier circuit 1426 and the second input port 1401*b* is shown to receive the second input signal 1436 from a second differential amplifier circuit 1428. However, in other embodiments, the first input port 1401*a* may be configured to receive the first input signal 1434 and the second input port 1401*b* may be configured to receive the second input signal 1436 from other differential devices that are different from differential amplifiers. The first DAT circuit 1402 further comprises a first secondary winding circuit 1403 arranged next to the first primary winding circuit 1401 and comprising a first secondary conductive loop (e.g., metal winding) comprising a first output port 1408 configured to provide a first output signal 1442. In some embodiments, the first output signal 1442 is generated at the first secondary winding circuit 1403 based on the first input signal 1434 and the second input signal 1436. In some embodiments, the first output port 1408 is arranged to be orthogonal with respect to the first input port 1401*a* and the second input port 1401*b*. However, in other embodiments, the first output port 1408 may be arranged differently. In this embodiment, the first output port 1408 comprises a single-ended output port with one of the terminals grounded. However, in other embodiments, the first output port 1408 may comprise a differential output port.

In some embodiments, the second DAT circuit 1404 comprises a second primary winding circuit 1451 comprising a second primary conductive loop (e.g., metal winding) comprising a third input port 1451*a* configured to receive a third input signal 1438 and a fourth input port 1451*b* configured to receive a fourth input signal 1440. In some embodiments, the third input port 1451*a* and the fourth input port 1451*b* are located at diagonally opposite directions with respect to one another along the second primary conductive loop. Alternately, in other embodiments, the third input port 1451*a* and the fourth input port 1451*b* may be arranged differently. In some embodiments, the third input signal 1438 and the fourth input signal 1440 comprise differential signals. In this embodiment, the third input port 1451*a* is shown to receive the third input signal 1438 from a third differential power amplifier circuit 1430 and the fourth input port 1451*b* is shown to receive the fourth input signal 1440 from a fourth differential amplifier circuit 1432. However, in other embodiments, the third input port 1451*a* may be configured to receive the third input signal 1438 and the fourth input port 1451*b* may be configured to receive the fourth input signal 1440 from other differential devices that are different from differential amplifiers.

The second DAT circuit 1404 further comprises a second secondary winding circuit 1453 arranged next to the second primary winding circuit 1451. In some embodiments, the second secondary winding circuit 1453 comprises a second secondary conductive loop (e.g., metal winding) comprising a second output port 1458 configured to provide a second output signal 1444, based on the third input signal 1438 and the fourth input signal 1440. In some embodiments, the second output port 1458 is arranged to be orthogonal with respect to the third input port 1451*a* and the fourth input port 1451*b*. However, in other embodiments, the second output port 1458 may be arranged differently. In this embodiment, the second output port 1458 comprises a single-ended output port with one of the terminals grounded. However, in other embodiments, the second output port 1458 may comprise a differential output port. In this embodiment, the first DAT circuit 1402 and the second DAT circuit 1404 are depicted as 2:1 power combiner configured to combine 2 input signals and generate an output signal based thereon. However, in other embodiments, the first DAT circuit 1402 and the second DAT circuit 1404 may be configured to combine more than 2 input signals. In such embodiments, the first primary winding circuit 1401 of the first DAT circuit 1402 and the second primary winding circuit 1451 of the second DAT circuit 1404 may comprise more than 2 input ports.

In some embodiments, the first output port 1408 of the first DAT circuit 1402 and the second output port 1458 of the second DAT circuit 1404 are electrically connected to one another. In some embodiments, the first output port 1408 of the first DAT circuit 1402 and the second output port 1458 of the second DAT circuit 1404 are electrically connected to one another at a coupling circuit 1406. In some embodiments, the coupling circuit 1406 is implemented as a part of the DAT power combiner circuit 1400. However, in other embodiments, the coupling circuit 1406 is implemented as a component external to the DAT power combiner circuit 1400. In this embodiment, the coupling circuit 1406 comprises a radio frequency (RF) pad configured to be coupled to a load circuit. In some embodiments, an RF pad comprises a signal pad and 2 ground pads. Alternately, in other embodiments, the coupling circuit 1406 may be implemented differently. In some embodiments, the coupling circuit 1406 is physically located between the first DAT circuit 1402 and the second DAT circuit 1404. In some embodiments, the first DAT circuit 1402 and the second DAT circuit 1404 are physically arranged in a way that the first output port 1408 of the first DAT circuit 1402 and the second output port 1458 of the second DAT circuit 1404 face one another from opposite directions. In some embodiments, the first output port 1408 of the first DAT circuit 1402 and the second output port 1458 of the second DAT circuit 1404 are exactly aligned with respect to one another. However, in other, embodiments, the alignment may be different. In some embodiments, such an arrangement enables the first DAT circuit 1402 and the second DAT circuit 1404 to couple to the coupling circuit 1406 from a minimum distance from the opposite ends. In some embodiments, reducing the distance between the output ports (i.e., 1408, 1458) and the coupling circuit 1406, reduces the loss associated with the extra leads connecting the output ports to the coupling circuit 1406, thereby further reducing the insertion loss of the DAT power combiner circuit 1400.

By making the secondary single-ended in the first DAT circuit 1402, in some embodiments, a port imbalance is created between the impedances seen from each of the first input port 1401a and the second input port 1401b. Therefore, in order to compensate for the port imbalance, a first conductive line 1415 (e.g., a metal conductor or winding) is included within the first primary winding circuit 1401, wherein the first conductive line 1415 (e.g., a metal conductor or winding) comprises a first end and a second, different end. In some embodiments, the first end of the first conductive line 1415 is coupled to a first segment (not shown) of the first primary conductive loop coupled between the first input port 1401a and the second input port 1401b, and the second end of the first conductive line 1415 is coupled to a second, different, segment (not shown) of the first primary conductive loop coupled between the first input port 1401a and the second input port 1401b, as explained above with respect to FIG. 13c.

In some embodiments, the first conductive line 1415 forces the centers of the two segments of the first primary conductive loop to have the same potential and thereby improve the imbalance due to an asymmetry on the capacitive coupling between the primary winding circuit 1401 and secondary winding circuit 1403. In some embodiments, the first DAT circuit 1402 further comprises a first dummy winding circuit 1422 comprising a first dummy conductive loop (e.g., a metal loop) having a first dummy port 1424 comprising a first dummy terminal that is grounded and a second, different, dummy terminal that is floating, as explained above with respect to FIG. 13d. In some embodiments, the first dummy winding circuit 1422 is physically arranged next to the first primary winding circuit 1401 in a way that the first primary conductive loop is located between the first secondary conductive loop and the first dummy conductive loop. In some embodiments, the first dummy port 1424 is arranged in a diagonally opposite direction with respect to the first output port 1408. In some embodiments, the first dummy winding circuit 1422 is also provided to compensate for the imbalance between the first primary winding circuit 1401 and the first secondary winding circuit 1403.

Similarly, by making the secondary single-ended in the second DAT circuit 1404, in some embodiments, a port imbalance is created between the impedances seen from each of the third input port 1451a and the fourth input port 1451b. Therefore, in order to compensate for the port imbalance, a second conductive line 1465 (e.g., a metal conductor or winding) is included within the second primary winding circuit 1465. In some embodiments, the second conductive line 1465 comprises a first end and a second, different end, wherein the first end is coupled to a first segment (not shown) of the second primary conductive loop coupled between the third input port 1451a and the fourth input port 1451b, and the second end is coupled to a second, different, segment (not shown) of the second primary conductive loop coupled between the third input port 1451a and the fourth input port 1451b, as explained above with respect to FIG. 13c.

In some embodiments, the second conductive line 1465 forces the centers of the two segments of the second primary conductive loop to have the same potential and thereby improve the imbalance due to an asymmetry on the capacitive coupling between the second primary winding circuit 1451 and the second secondary winding circuit 1453. In some embodiments, the second DAT circuit 1404 further comprises a second dummy winding circuit 1472 comprising a second dummy conductive loop (e.g., a metal loop) having a second dummy port 1474 comprising a first dummy terminal that is grounded and a second, different, dummy terminal that is floating, as explained above with respect to FIG. 13d. In some embodiments, the second dummy winding circuit 1472 is physically arranged next to the second primary winding circuit 1451 in a way that the second primary conductive loop is located between the second secondary conductive loop and the second dummy conductive loop. In some embodiments, the second dummy port 1474 is arranged in a diagonally opposite direction with respect to the second output port 1458. In some embodiments, the second dummy winding circuit 1472 is also provided to compensate for the imbalance between the second primary winding circuit 1451 and the second secondary winding circuit 1453.

Figure 15A:
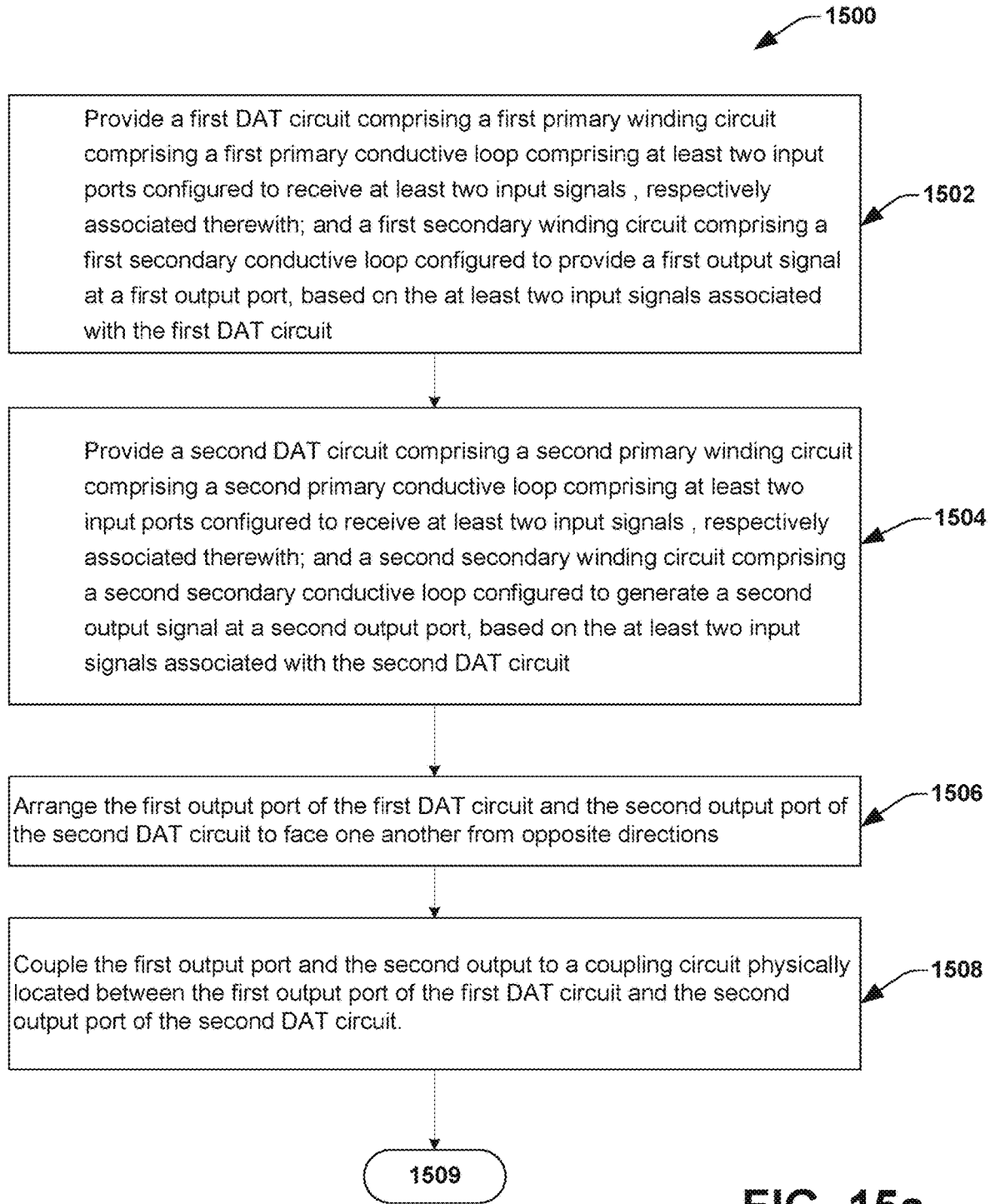
FIG. 15a and FIG. 15b illustrates a flowchart of a method of a distributed active transformer (DAT) power combiner circuit, according to one embodiment of the disclosure.
Figure 15B:
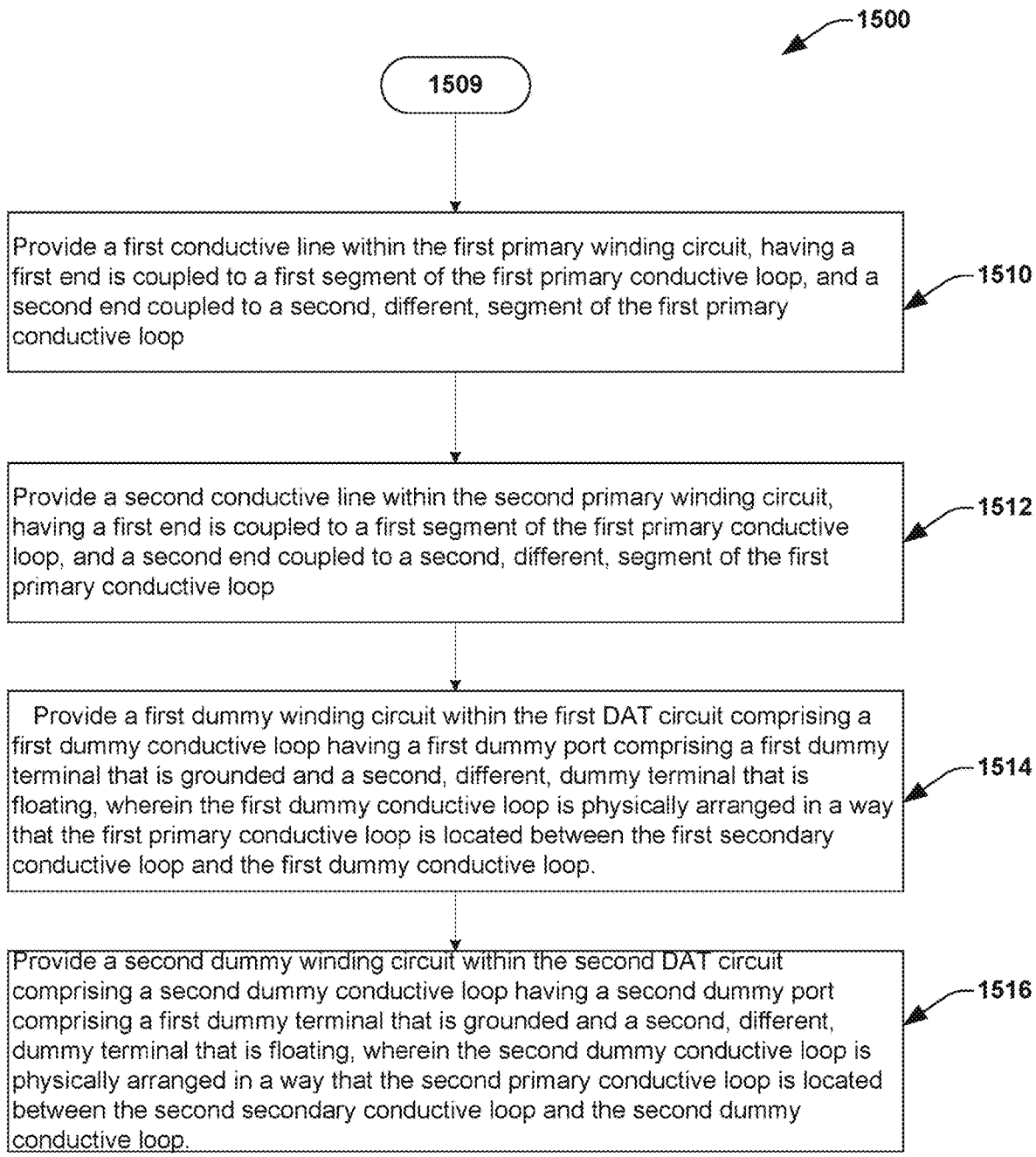

FIG. 15a and FIG. 15b illustrates a flowchart of a method 1500 of a distributed active transformer (DAT) power combiner circuit, according to one embodiment of the disclosure. It is noted herein that the flowchart 1500 in FIG. 15b is a continuation of the flowchart 1500 in FIG. 15a and are not to be construed as separate methods/flowcharts. The method 1500 is explained herein with reference to the DAT power combiner circuit 1400 in FIG. 14. At 1502, a first DAT circuit (e.g., the first DAT circuit 1402 in FIG. 14) comprising a first primary winding circuit (e.g., first primary winding circuit 1401 in FIG. 14) and a first secondary winding circuit (e.g., the first secondary winding circuit 1403 in FIG. 14) is provided. In some embodiments, the first primary winding circuit comprises a first primary conductive loop comprising at least two input ports (e.g., the first input port 1401a and the second input port 1401b in FIG. 14) configured to receive at least two input signals (e.g., the first input signal 1434 and the second input signal 1436 in FIG. 14), respectively associated therewith; and the first secondary winding circuit comprises a first secondary conductive loop comprising a first output port (e.g., the first output port 1408 in FIG. 14) configured to provide a first output signal (e.g., the first output signal 1442 in FIG. 14), based on the at least two input signals associated with the first primary winding circuit.

At 1504, a second DAT circuit (e.g., the second DAT circuit 1404 in FIG. 14) comprising a second primary winding circuit (e.g., the second primary winding circuit 1451 in FIG. 14) and a second secondary winding circuit (e.g., the second secondary winding circuit 1453 in FIG. 14) is provided. In some embodiments, the second primary winding circuit comprises a second primary conductive loop comprising at least two input ports (e.g., the third input port 1451a and the fourth input port 1451b in FIG. 14) configured to receive at least two input signals (e.g., the third input signal 1438 and the fourth input signal 1440 in FIG. 14), respectively associated therewith; and the second secondary winding circuit comprises a second secondary conductive loop comprising a second output port (e.g., the second output port 1458 in FIG. 14) configured to provide a second output signal (e.g., the second output signal 1444 in FIG. 14), based on the at least two input signals associated with the second DAT circuit. In some embodiments, the two input signals associated with the first primary winding circuit and the two input signals associated with the second primary winding circuit are different. At 1506, the first output port of the first DAT circuit and the second output port of the second DAT circuit are arranged to face one another from opposite directions. At 1508, the first output port and the second output are coupled to a coupling circuit (e.g., the coupling circuit 1406 in FIG. 14) physically located between the first output port of the first DAT circuit and the second output port of the second DAT circuit.

At 1510, a first conductive line (e.g., the first conductive line 1415 in FIG. 14) is provided within the first primary winding circuit. In some embodiments, the first conductive line comprises a first end coupled to a first segment of the first primary conductive loop, and a second end coupled to a second, different, segment of the first primary conductive loop, as explained above with respect to FIG. 14. In some embodiments, the first conductive line is provided when the first primary winding circuit comprises 2 input ports. In some embodiments, the first conductive line is provided to compensate for the port imbalance, as explained with respect to FIG. 13c and FIG. 14 above. At 1512, a second conductive line (e.g., the second conductive line 1465 in FIG. 14) is provided within the second primary winding circuit. In some embodiments, the second conductive line comprises a first end coupled to a first segment of the first primary conductive loop, and a second end coupled to a second, different, segment of the first primary conductive loop. In some embodiments, the second conductive line is provided when the second primary winding circuit comprises 2 input ports. In some embodiments, the second conductive line is provided to compensate for the port imbalance, as explained with respect to FIG. 13c and FIG. 14 above.

At 1514, a first dummy winding circuit (e.g., the first dummy winding circuit 1422 in FIG. 14) is provided within the first DAT circuit. In some embodiments, the first dummy winding circuit comprises a first dummy conductive loop having a first dummy port (e.g., the first dummy port 1424 in FIG. 14) comprising a first dummy terminal that is grounded and a second, different, dummy terminal that is floating. In some embodiments, the first dummy conductive loop is physically arranged in a way that the first primary conductive loop is located between the first secondary conductive loop and the first dummy conductive loop. At 1516, a second dummy winding circuit (e.g., the second dummy winding circuit 1472 in FIG. 14) is provided within the second DAT circuit. In some embodiments, the second dummy winding circuit comprises a second dummy conductive loop having a second dummy port (e.g., the second dummy port 1474 in FIG. 14) comprising a first dummy terminal that is grounded and a second, different, dummy terminal that is floating. In some embodiments, the second dummy conductive loop is physically arranged in a way that the second primary conductive loop is located between the second secondary conductive loop and the second dummy conductive loop.

Figure 16:
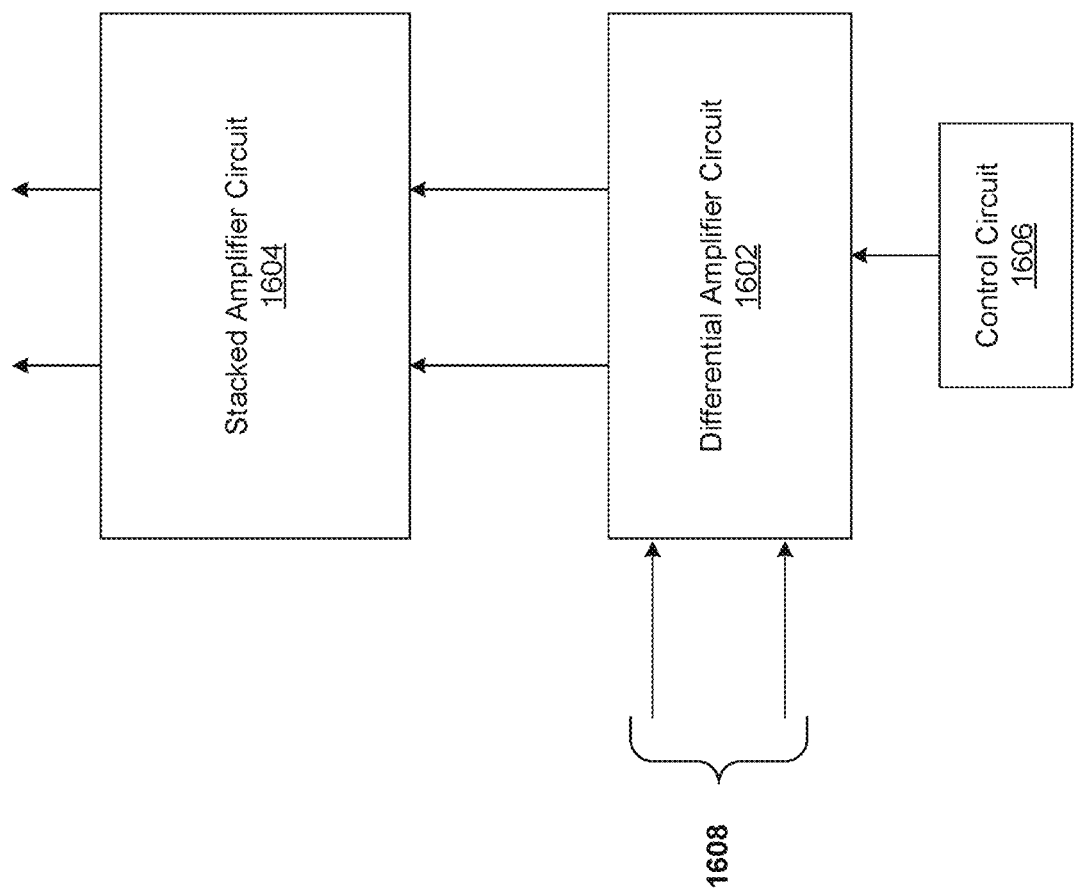
FIG. 16 depicts a simplified block diagram of a stacked differential amplifier circuit, according to one embodiment of the disclosure.

FIG. 16 depicts a simplified block diagram of a stacked differential amplifier circuit 1600, according to one embodiment of the disclosure. The stacked differential amplifier circuit 1600 comprises a differential amplifier circuit 1602, a stacked amplifier circuit 1604 and a control circuit 1606. In some embodiments, the differential amplifier circuit 1602 comprises a plurality of unit cell amplifier circuits coupled in parallel to one another. In some embodiments, each of the unit cell amplifier circuits associated with the differential amplifier circuit 1602 may be configured to receive a differential input signal 1608. In some embodiments, each of the unit cell amplifier circuits may comprise a first unit cell transistor circuit and a second, different, unit cell transistor circuit coupled to one another in a differential arrangement, further details of which are given in an embodiment below. In some embodiments, the stacked amplifier circuit 1604 may comprise a first stacked transistor circuit and a second stacked transistor circuit and is configured to be coupled to the differential amplifier circuit 1602, further details of which are given in an embodiment below. In particular, in some embodiments, the first unit cell transistor circuit associated with each of the unit cell amplifier circuits are configured to be coupled in series to the first stacked transistor circuit associated with the stacked amplifier circuit 1604. Similarly, in some embodiments, the second unit cell transistor circuit associated with each of the unit cell amplifier circuits are configured to be coupled in series to the second stacked transistor circuit associated with the stacked amplifier circuit 1604.

In some embodiments, each of the unit cell amplifier circuits associated with the differential amplifier circuit 1602 may comprise a respective tail current switch circuit coupled to the differential arrangement of the first unit cell transistor circuit and the second unit cell transistor circuit. In some embodiments, the tail current switch circuit is configured to selectively activate or deactivate a respective unit cell amplifier circuit. In some embodiments, the control circuit 1606 is coupled to the differential amplifier circuit 1602 and is configured to selectively turn on or turn off one or more the tail current switch circuits associated therewith, in order to selectively activate or deactivate one or more respective unit cell amplifier circuits. In some embodiments, selectively activating and deactivating one or more unit cell amplifier circuits enables to improve the efficiency of the stacked differential amplifier circuit 1600 during low power operations. In some embodiments, the control circuit 1606 comprises a digital control circuit configured to control the plurality of tail current switch circuits digitally. In some embodiments, when all the unit cell amplifier circuits are activated, the stacked differential amplifier circuit 1600 operates at its peak output power. In some embodiments, each of the unit cell amplifier circuits are identical to one another. However, in other embodiments, each of the unit cell amplifier circuits may be different. In some embodiments, in order to enable digital configurability, the configuration of each of the unit cell amplifier circuit is derived based on segmenting a differential amplifier circuit (or the transistors associated therewith) configured for peak power operation into the plurality of unit cell amplifier circuits in a binary fashion (e.g., if segmented into 7 bits, then 128 identical unit cell amplifier circuits may be derived).

Figure 17:
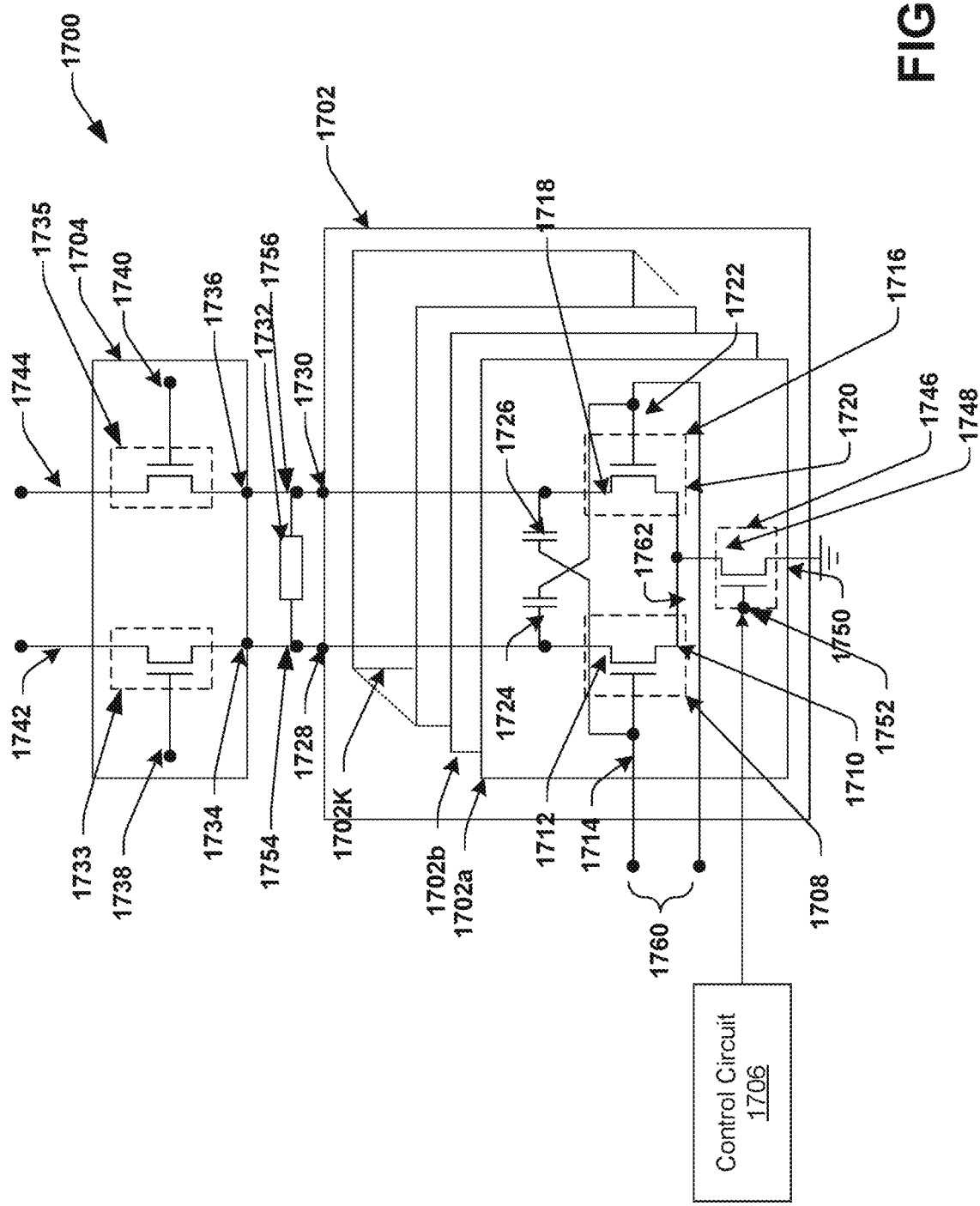
FIG. 17 depicts a stacked differential amplifier circuit, according to one embodiment of the disclosure.

FIG. 17 depicts a stacked differential amplifier circuit 1700, according to one embodiment of the disclosure. In some embodiments, the stacked differential amplifier circuit 1700 depicts a detailed diagram of the stacked differential amplifier circuit 1600 in FIG. 16. The stacked differential amplifier circuit 1700 comprises a differential amplifier circuit 1702, a stacked amplifier circuit 1704 and a control circuit 1706. In some embodiments, the differential amplifier circuit 1702 comprises a plurality of unit cell amplifier circuits 1702a, 1702b . . . 1702K coupled in parallel to one another. In some embodiments, each of the unit cell amplifier circuits, for example, the unit cell amplifier circuit 1702a comprises a first unit cell transistor circuit 1708 comprising a first transistor terminal 1710, a second transistor terminal 1712 and a third transistor terminal 1714. In some embodiments, the unit cell amplifier circuit 1702a further comprises a second unit cell transistor circuit 1716 comprising a fourth transistor terminal 1720, a fifth transistor terminal 1718 and a sixth transistor terminal 1722. All the explanation given here with respect to the unit cell amplifier circuit 1702a is equally applicable to all the unit cell amplifier circuits 1702a . . . 1702K, and is not to be construed to be Ii d to the unit cell amplifier circuit 1702a.

In some embodiments, the first unit cell transistor circuit 1708 and the second unit cell transistor circuit 1716 comprises metal-oxide semiconductor field effect transistors (MOSFETs). In some embodiments, first transistor terminal 1710, the second transistor terminal 1712 and the third transistor terminal 1714 associated with the first unit cell transistor circuit 1708 comprises a source terminal, a drain terminal and a gate terminal, respectively. However, in other embodiments, the first transistor terminal 1710, the second transistor terminal 1712 and the third transistor terminal 1714 associated with the first unit cell transistor circuit 1708 may be configured differently. Similarly, in some embodiments, the fourth transistor terminal 1720, the fifth transistor terminal 1718 and the sixth transistor terminal 1722 associated with the second unit cell transistor circuit 1716 comprises a source terminal, a drain terminal and a gate terminal, respectively. However, in other embodiments the fourth transistor terminal 1720, the fifth transistor terminal 1718 and the sixth transistor terminal 1722 associated with the second unit cell transistor circuit 1716 may be configured differently.

In some embodiments, the first transistor terminal 1710 of the first unit cell transistor circuit 1708 and the fourth transistor terminal 1720 of the second unit cell transistor circuit 1716 are coupled to one another to form a differential arrangement. In some embodiments, the second transistor terminal 1712 of the first unit cell transistor circuit 1708 associated with each of the unit cell amplifier circuits 1702*a*, 1702*b* . . . 1702K are coupled together to form a first differential output terminal 1728 associated with the differential amplifier circuit 1702. Similarly, the fifth transistor terminal 1718 of the second unit cell transistor circuit 1716 associated with each of the unit cell amplifier circuits 1702*a*, 1702*b* . . . 1702K are coupled together to form a second differential output port 1730 associated with the differential amplifier circuit 1702. In some embodiments, the third transistor terminal 1714 of the first unit cell transistor circuit 1708 and the sixth transistor terminal 1722 of the second unit cell transistor circuit 1716 associated with each of the unit cell amplifier circuits 1702*a*, 1702*b* . . . 1702K may be coupled to a differential input circuit (not shown) configured to provide a differential input signal 1760 to the unit cell amplifier circuits 1702*a*, 1702*b* . . . 1702K.

In some embodiments, the third transistor terminal 1714 of the first unit cell transistor circuit 1708 and the sixth transistor terminal 1722 of the second unit cell transistor circuit 1716 associated with each of the unit cell amplifier circuits 1702*a*, 1702*b* . . . 1702K may be further coupled to an input bias circuit (not shown) configured to provide a bias voltage to the third transistor terminal 1714 of the first unit cell transistor circuit 1708 and the sixth transistor terminal 1722 of the second unit cell transistor circuit 1716. In some embodiments, the unit cell amplifier circuit 1702*a* further comprises a tail current switch circuit 1746 comprising a transistor circuit configured to selectively activate or deactivate the unit cell amplifier circuit 1702*a*. In some embodiments, when the tail current switch circuit 1746 is turned on, the respective unit cell amplifier circuit (e.g., the unit cell amplifier circuit 1702*a*) is activated and when the tail current switch circuit 1746 is turned off, the respective unit cell amplifier circuit is deactivated. In some embodiments, the tail current switch circuit 1746 comprises a first tail terminal 1748, a second tail terminal 1750 and a third tail terminal 1752. In some embodiments, the first tail terminal 1748, the second tail terminal 1750 and the third tail terminal 1752 comprises a drain terminal, a source terminal and a gate terminal, respectively. However, in other embodiments, the first tail terminal 1748, the second tail terminal 1750 and the third tail terminal 1752 associated with the tail current switch circuit 1746 may be configured differently.

In some embodiments, the first tail terminal 1748 of the tail current switch circuit 1746 is coupled to a differential conductive line 1762 that couples the first transistor terminal 1710 of the first unit cell transistor circuit 1708 and the fourth transistor terminal 1720 of the second unit cell transistor circuit 1716. In some embodiments, the differential conductive line 1762 refers to any conductive medium that electrically couples the first transistor terminal 1710 of the first unit cell transistor circuit 1708 and the fourth transistor terminal 1720 of the second unit cell transistor circuit 1716. In some embodiments, the differential conductive line 1762 may be part of the first transistor terminal 1710 and the fourth transistor terminal 1720 itself. However, in other embodiments, the differential conductive line 1762 may not be a part of the first transistor terminal 1710 and the fourth transistor terminal 1720 itself, and may include a conductive trace etc. In some embodiments, the second tail terminal 1750 of the tail current switch circuit 1746 is coupled to a common ground.

Further, in some embodiments, the third tail terminal 1752 of the tail current switch circuit 1746 is coupled to the control circuit 1706. In some embodiments, the control circuit 1706 is configured to turn on or turn off the tail current switch circuit 1746, in order to selectively activate or deactivate the unit cell amplifier circuit 1702*a*, based on the output requirements of the stacked differential amplifier circuit 1700, In some embodiments, the control circuit 1706 is further configured to turn on or turn off one or more of the tail current switch circuits 1746 associated with the one or more of the unit cell amplifier circuits 1702*a*, 1702*b* . . . 1702K, in order to selectively activate or deactivate the respective unit cell amplifier circuits. In some embodiments, selectively activating and deactivating one or more unit cell amplifier circuits 1702*a*, 1702*b*, . . . 1702K enables to improve the efficiency of the stacked differential amplifier circuit 1700 during low power operations. In some embodiments, the control circuit 1706 comprises a digital control circuit configured to control the plurality of tail current switch circuits digitally. In some embodiments, when all the unit cell amplifier circuits 1702*a*, 1702*b* . . . 1702K are activated, the stacked differential amplifier circuit 1700 operates at its peak output power. In some embodiments, configuration of each of the unit cell amplifier circuits 1702*a*, 1702*b* . . . 1702K are identical to one another. However, in other embodiments, configuration of each of the unit cell amplifier circuits 1702*a*, 1702*b* . . . 1702K may be different. In some embodiments, in order to enable digital configurability, the configuration of each of the unit cell amplifier circuits 1702*a*, 1702*b* . . . 1702K is derived based on segmenting a differential amplifier circuit (or the transistors associated therewith) configured for peak power operation into the plurality of unit cell amplifier circuits in a binary fashion (e.g., if segmented into 7 bits, then 128 identical unit cell amplifier circuits may be derived).

In some embodiments, the stacked amplifier circuit 1704 comprises a first stacked transistor circuit 1733 comprising a first stacked terminal 1734, a second stacked terminal 1742 and a third stacked terminal 1738. In some embodiments, the stacked amplifier circuit 1704 further comprises a second stacked transistor circuit 1735 comprising a fourth stacked terminal 1736, a fifth stacked terminal 1744 and a sixth stacked terminal 1740. In some embodiments, the first stacked transistor circuit 1733 and the second stacked transistor circuit 1735 comprise MOSFETs. In some embodiments, the first stacked terminal 1734, the second stacked terminal 1742 and the third stacked terminal 1738 associated with the first stacked transistor circuit 1733 comprises a source terminal, a drain terminal and a gate terminal, respectively. However, in other embodiments, the first stacked terminal 1734, the second stacked terminal 1742 and the third stacked terminal 1738 associated with the first stacked transistor circuit 1733 may be configured differently. In some embodiments, the fourth stacked terminal 1736, the fifth stacked terminal 1744 and the sixth stacked terminal 1740 associated with the second stacked transistor circuit 1735 comprises a source terminal, a drain terminal and a gate terminal, respectively. However, in other embodiments, the fourth stacked terminal 1736, the fifth stacked terminal 1744 and the sixth stacked terminal 1740 associated with the second stacked transistor circuit 1735 may be configured differently.

In some embodiments, the first stacked terminal 1734 of the first stacked transistor circuit 1733 is coupled to the first differential output terminal 1728 of the differential amplifier circuit 1702. Similarly, in some embodiments, the fourth stacked terminal 1736 of the second stacked transistor circuit 1735 is coupled to the second differential output terminal 1730 of the differential amplifier circuit 1702. In some embodiments, the second stacked terminal 1742 of the first stacked transistor circuit 1733 and the fifth stacked terminal 1744 of the second stacked transistor circuit 1735 are configured to be coupled to a further circuit (not shown), for example, a load circuit. In some embodiments, the second stacked terminal 1742 of the first stacked transistor circuit 1733 and the fifth stacked terminal 1744 of the second stacked transistor circuit 1735 together comprises a differential output port associated with the stacked differential amplifier circuit 1700 and is configured to provide a differential output signal to the further circuit. In some embodiments, the further circuit may comprise another stacked amplifier circuit (not shown) to enable multiple levels of stacking, in order to increase the output power delivered by the stacked differential amplifier circuit 1700. In some embodiments, the third stacked terminal 1738 of the first stacked transistor circuit 1733 may be coupled to a first stacked bias circuit (not shown) configured to bias the first stacked transistor circuit 1733. Similarly, in some embodiments, the sixth stacked terminal 1740 of the second stacked transistor circuit 1735 may be coupled to a second stacked bias circuit (not shown) configured to bias the second stacked transistor circuit 1735.

In some embodiments, the unit cell amplifier circuit 1702a further comprises a first neutralization capacitance 1724 coupled between the drain terminal 1712 of the first unit cell transistor circuit 1708 and the gate terminal 1722 of the second unit cell transistor circuit 1716. In some embodiments, the first neutralization capacitance 1724 enables to neutralize the gate drain capacitance associated with the first unit cell transistor circuit 1708. In some embodiments, the first neutralization capacitance 1724 for each of the unit cell amplifier circuits 1702a, 1702b . . . 1702K are realized using overlapping metal capacitances, thereby enabling to realize a compact layout. In some embodiments, the unit cell amplifier circuit 1702a further comprises a second neutralization capacitance 1726 coupled between the drain terminal 1718 of the second unit cell transistor circuit 1716 and the gate terminal 1714 of the first unit cell transistor circuit 1708. In some embodiments, the second neutralization capacitance 1726 enables to neutralize the gate drain capacitance associated with the second unit cell transistor circuit 1716. In some embodiments, the second neutralization capacitance 1726 for each of the unit cell amplifier circuits 1702a, 1702b . . . 1702K are realized using overlapping metal capacitances, thereby enabling to realize a compact layout.

In some embodiments, the stacked differential amplifier circuit 1700 further comprises a differential shunt stub circuit 1732. In some embodiments, the differential shunt stub circuit 1732 is configured to provide a better match between the first unit cell transistor circuit 1708 associated with each of the unit cell amplifier circuits 1702a, 1702b . . . 1702K and the first stacked amplifier circuit 1733. In some embodiments, the differential shunt stub circuit 1732 is further configured to provide a better match between the second unit cell transistor circuit 1716 associated with each of the unit cell amplifier circuits 1702a, 1702b . . . 1702K and the second stacked amplifier circuit 1735. In some embodiments, the differential shunt stub circuit 1732 comprises a transmission line. However, in other embodiments, the differential shunt stub circuit 1732 may be implemented differently. In some embodiments, the differential shunt stub circuit 1732 comprises a first end and a second, different end. In some embodiments, the first end of the differential shunt stub circuit 1732 is coupled to a first conductive line 1754 that couples the first differential output terminal 1728 of the differential amplifier circuit 1702 to the first stacked terminal 1734 of the first stacked transistor circuit 1733. In some embodiments, the second end of the differential shunt stub circuit 1732 is coupled to a second conductive line 1756 that couples the second differential output terminal 1730 of the differential amplifier circuit 1702 to the fourth stacked terminal 1736 of the second stacked transistor circuit 1735. In some embodiments, the first conductive line 1754 refers to any conductive medium that electrically couples the first differential output terminal 1728 of the differential amplifier circuit 1702 to the first stacked terminal 1734 of the first stacked transistor circuit 1733. In some embodiments, the first conductive line 1754 may be part of the first differential output terminal 1728 and the first stacked terminal 1734 itself. However, in other embodiments, the first conductive line 1754 may not be a part of the first differential output terminal 1728 and the first stacked terminal 1734 itself, and may include a conductive trace etc. Similarly, in some embodiments, the second conductive line 1756 refers to any conductive medium that electrically couples the second differential output terminal 1730 of the differential amplifier circuit 1702 to the fourth stacked terminal 1736 of the second stacked transistor circuit 1735, In some embodiments, the second conductive line 1756 may be part of the second differential output terminal 1730 and the fourth stacked terminal 1736 itself. However, in other embodiments, the second conductive line 1756 may not be a part of the second differential output terminal 1730 and the fourth stacked terminal 1736 itself, and may include a conductive trace etc.

Figure 18A:
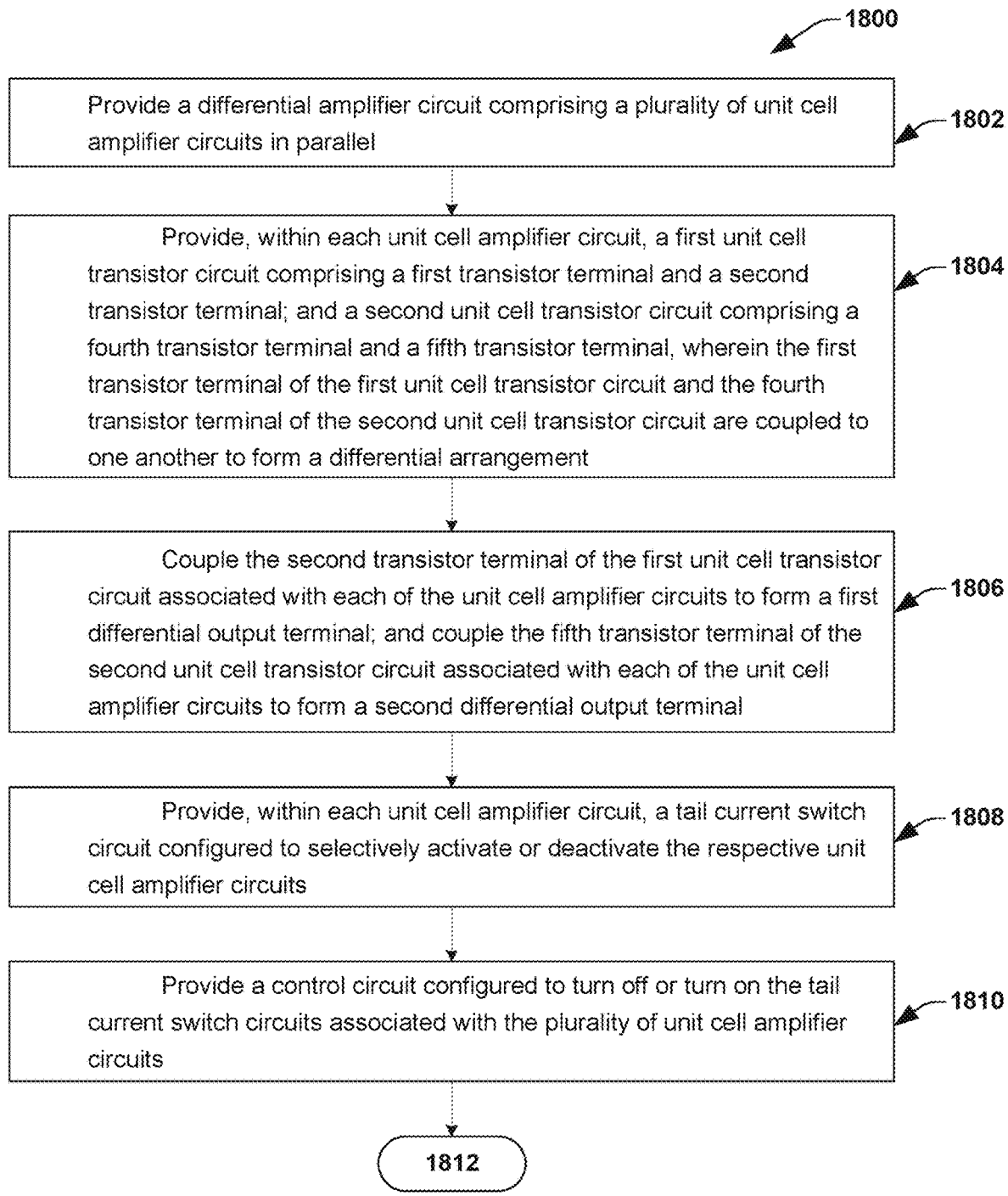
FIG. 18a and FIG. 18b illustrates a flowchart of a method of a stacked differential amplifier circuit, according to one embodiment of the disclosure.
Figure 18B:
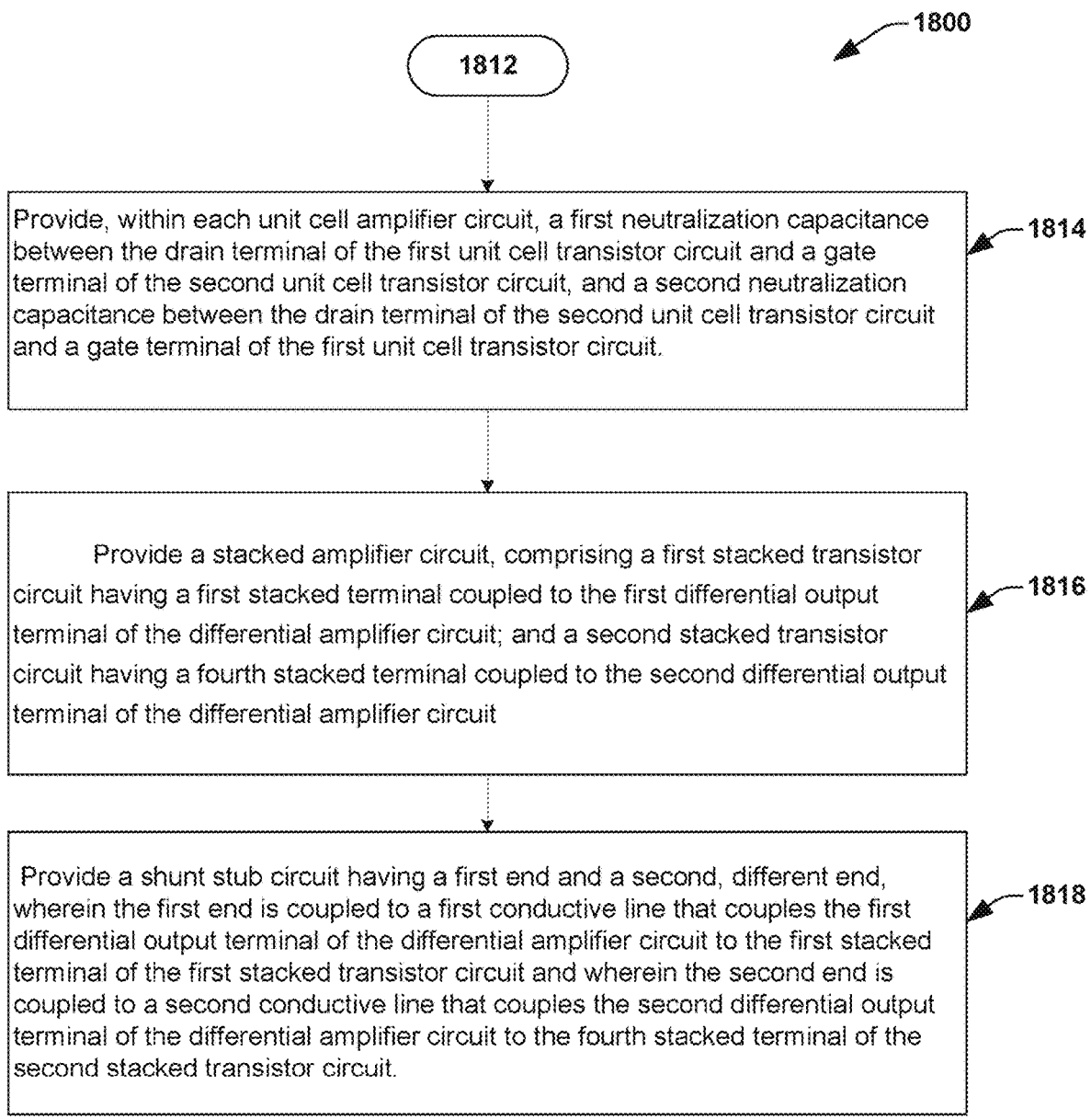

FIG. 18a and FIG. 18b illustrates a flowchart of a method 1800 of a stacked differential amplifier circuit, according to one embodiment of the disclosure. It is noted herein that the flowchart 1800 in FIG. 18b is a continuation of the flowchart 1800 in FIG. 18a and are not to be construed as separate methods/flowcharts. The method 1800 is explained herein with reference to the stacked differential amplifier circuit 1700 in FIG. 17. At 1802, a differential amplifier circuit (e.g., the differential amplifier circuit 1702 in FIG. 17) comprising a plurality of unit cell amplifier circuits (e.g., the plurality of unit cell amplifier circuits 1702a, 1702b . . . 1702K) in parallel is provided. At 1804, a first unit cell transistor circuit (e.g., the first unit cell transistor circuit 1708 in FIG. 17) comprising a first transistor terminal (e.g., the first transistor terminal 1710 in FIG. 17) and a second transistor terminal (e.g., the second transistor terminal 1712 in FIG. 17); and a second unit cell transistor circuit (e.g., the second unit cell transistor circuit 1716 in FIG. 17) comprising a fourth transistor terminal (e.g., the fourth transistor terminal 1720 in FIG. 17) and a fifth transistor terminal (e.g., the fifth transistor terminal 1718 in FIG. 17) are provided within each unit cell amplifier circuit. In some embodiments, the first transistor terminal of the first unit cell transistor circuit and the fourth transistor terminal of the second unit cell transistor circuit are coupled to one another to form a differential arrangement. At 1806, the second transistor terminal of the first unit cell transistor circuit associated with each of the unit cell amplifier circuits is coupled to one another to form a first differential output terminal (e.g., the first differential output terminal 1728 in FIG. 17) associated with the differential amplifier circuit; and the fifth transistor terminal of the second unit cell transistor circuit associated with each of the unit cell amplifier circuits are coupled to one another to form a second differential output terminal (e.g., the second differential output terminal 1730 in FIG. 17) associated with the differential amplifier circuit.

At 1808, a tail current switch circuit (e.g., the tail current switch circuit 1746 in FIG. 17) is provided within each of the unit cell amplifier circuits. In some embodiments, the tail current switch circuit is configured to selectively activate or deactivate the respective unit cell amplifier circuit. At 1810, a control circuit (e.g., the control circuit 1706 in FIG. 17) configured to turn off or turn on the tail current switch circuits associated with the plurality of unit cell amplifier circuits is provided. In some embodiments, the control circuit comprises a digital control circuit configured to turn on or turn off the tail current switch circuit digitally. In some embodiments, turning on or turning off the tail current switch circuits enables to activate or deactivate the respective unit cell amplifier circuits. At 1814, a first neutralization capacitance (e.g., the first neutralization capacitance 1724 in FIG. 17) is provided within each unit cell amplifier circuit between the drain terminal (e.g., the drain terminal 1712 in FIG. 17) of the first unit cell transistor circuit and the gate terminal (e.g., the gate terminal 1722 in FIG. 17) of the second unit cell transistor circuit, and a second neutralization capacitance (e.g., the second neutralization capacitance 1726 in FIG. 17) is provided within each unit cell amplifier circuit between the drain terminal (e.g., the drain terminal 1718 in FIG. 17) of the second unit cell transistor circuit and the gate terminal (e.g., the gate terminal 1714 in FIG. 17) of the first unit cell transistor circuit.

At 1816, a stacked amplifier circuit (e.g., the stacked amplifier circuit 1704 in FIG. 17) comprising a first stacked transistor circuit (e.g., the first stacked transistor circuit 1733 in FIG. 17) having a first stacked terminal (e.g., the first stacked terminal 1734) coupled to the first differential output terminal of the differential amplifier circuit; and a second stacked transistor circuit (e.g., the second stacked transistor circuit 1735 in FIG. 17) having a fourth stacked terminal (e.g., the fourth stacked terminal 1736 in FIG. 17) coupled to the second differential output terminal of the differential amplifier circuit is provided. At 1818, a differential shunt stub circuit (e.g., the differential shunt stub circuit 1732 in FIG. 17) having a first end and a second, different end is provided. In some embodiments, the first end of the differential shunt stub circuit is coupled to a first conductive line (e.g., the first conductive line 1754 in FIG. 17) that couples the first differential output terminal of the differential amplifier circuit to the first stacked terminal of the first stacked transistor circuit and wherein the second end of the differential shunt stub circuit is coupled to a second conductive line (e.g., the second conductive line 1756 in FIG. 17) that couples the second differential output terminal of the differential amplifier circuit to the fourth stacked terminal of the second stacked transistor circuit.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an on-chip transformer circuit, comprising a primary winding circuit comprising at least one turn of a primary conductive winding arranged as a first N-sided polygon in a first dielectric layer of a substrate; and a secondary winding circuit comprising at least one turn of a secondary conductive winding arranged as a second N-sided polygon in a second, different, dielectric layer of the substrate; and wherein the primary winding circuit and the secondary winding circuit are arranged to overlap one another at predetermined locations along the primary conductive winding and the secondary conductive winding, wherein the predetermined locations comprise a number of locations less than all locations along the primary conductive winding and the secondary conductive winding.

Example 2 is a transformer circuit, including the subject matter of example 1, wherein the primary winding circuit comprises a primary feeding port comprising two primary signal terminals associated with the primary conductive winding arranged on any one side of the first N-sided polygon and wherein the secondary winding circuit comprises a secondary feeding port comprising two secondary signal terminals associated with the secondary conductive winding arranged on any one side of the second N-sided polygon.

Example 3 is a transformer circuit, including the subject matter of examples 1-2, including or omitting elements, wherein the secondary winding circuit is rotated with respect to the primary winding circuit by a predefined rotation angle such that the primary winding circuit and the secondary winding circuit overlap one another at the predetermined locations along the primary conductive winding and the secondary conductive winding.

Example 4 is a transformer circuit, including the subject matter of examples 1-3, including or omitting elements, wherein the primary winding circuit and the secondary winding circuit are identical to one another in shape and size.

Example 5 is a transformer circuit, including the subject matter of examples 1-4, including or omitting elements, wherein the primary winding circuit and the secondary winding circuit are symmetrically arranged with respect to a common center point and wherein the secondary winding circuit is rotated with respect to the primary winding circuit by the predefined rotation angle in reference to the common center point.

Example 6 is a transformer circuit, including the subject matter of examples 1-5, including or omitting elements, wherein the primary winding circuit is arranged to be symmetric with respect to a primary center line comprising a straight line between the two primary terminals of the primary feeding port associated with the primary winding circuit and the secondary winding circuit is arranged to be symmetric with respect to a secondary center line comprising a straight line between the two secondary terminals of the secondary feeding port associated with the secondary winding circuit, wherein the primary center line and the secondary center line passes through the common center point.

Example 7 is a transformer circuit, including the subject matter of examples 1-6, including or omitting elements, wherein the N-sided polygon associated with the primary winding circuit and the secondary winding circuit comprises an octagon.

Example 8 is a transformer circuit, including the subject matter of examples 1-7, including or omitting elements, wherein the predefined rotation angle between the primary winding circuit and the secondary winding circuit comprises 45 degrees.

Example 9 is a transformer circuit, including the subject matter of examples 1-8, including or omitting elements, wherein the secondary conductive winding associated with the secondary winding circuit and the primary conductive winding associated with the primary winding circuit are interleaved with respect to one another, at one or more respective sides, forming one or more interleaved sides, along the primary conductive winding and the secondary conductive winding such that the primary winding circuit and the secondary winding circuit overlap one another at the predetermined locations along the primary conductive winding and the secondary conductive winding.

Example 10 is a transformer circuit, including the subject matter of examples 1-9, including or omitting elements, wherein the primary winding circuit and the secondary winding circuit are arranged to be symmetrical with respect to a center line, wherein the center line passes through the middle of the two primary signal terminals associated with the primary conductive winding and two secondary signal terminals associated with the secondary conductive winding, and wherein the two primary signal terminals and the two secondary terminals are arranged in opposite directions with respect to one another.

Example 11 is a transformer circuit, including the subject matter of examples 1-10, including or omitting elements, wherein the N sides of primary winding circuit are symmetrically aligned with respect to corresponding N sides of the secondary winding circuit, forming N aligned sides of the on-chip transformer circuit Example 12 is a transformer circuit, including the subject matter of examples 1-11, including or omitting elements, wherein the one or more interleaved sides comprises at least one side pair, wherein the at least one side pair comprises two aligned sides that are mirrored about the center line.

Example 13 is a transformer circuit, including the subject matter of examples 1-12, including or omitting elements, wherein the one or more interleaved sides comprises every aligned side except the aligned sides comprising the primary feeding port and the secondary feeding port.

Example 14 is a transformer circuit, including the subject matter of examples 1-13, including or omitting elements, wherein the primary winding circuit comprises a primary center-tap port comprising a metal connection coupled to a center point of the primary conductive winding with respect to the two primary signal terminals, and wherein the secondary winding circuit comprises a secondary center-tap port comprising a metal connection coupled to a center point of the secondary conductive winding with respect to the two secondary signal terminals.

Example 15 is a transformer circuit, including the subject matter of examples 1-14, including or omitting elements, wherein the N sides of the first N-sided polygon and the second N-sided polygon comprises four or more sides.

Example 16 is a transformer circuit, including the subject matter of examples 1-15, including or omitting elements, wherein the first N-sided polygon and the second N-sided polygon comprise equal sided polygons or non-equal sided polygons.

Example 17 is a transformer circuit, including the subject matter of examples 1-16, including or omitting elements, wherein the first N-sided polygon and the second N-sided polygon comprise equal sided polygons.

Example 18 is a transformer circuit, including the subject matter of examples 1-17, including or omitting elements, further comprising a primary center tap port comprising a first conductive connection in a third, different layer of the substrate and coupled to a center point of the primary conductive winding via a plurality of vias, and a secondary center tap port comprising a second conductive connection in the third layer of the substrate and coupled to a center point of the secondary conductive winding via a plurality of vias.

Example 19 is a distributed active transformer (DAT) power combiner circuit, comprising a first DAT circuit comprising a first primary winding circuit comprising a first primary conductive loop comprising at least two input ports configured to receive at least two input signals, respectively associated therewith; and a first secondary winding circuit comprising a first secondary conductive loop comprising a first output port configured to provide a first output signal, based on the at least two input signals associated with the first primary winding circuit; and a second DAT circuit comprising a second primary winding circuit comprising a second primary conductive loop comprising at least two input ports configured to receive at least two input signals, respectively associated therewith; and a second secondary winding circuit comprising a second secondary conductive loop comprising a second output port configured to provide a second output signal, based on the at least two input signals associated with the second primary winding circuit, wherein the two input signals associated with the first primary winding circuit and the two input signals associated with the second primary winding circuit are different; and wherein the first DAT circuit and the second DAT circuit are physically arranged in a way that the first output port of the first DAT circuit and the second output port of the second DAT circuit face one another from opposite directions.

Example 20 is a DAT circuit, including the subject matter of example 19, wherein the first output port of the first DAT circuit and the second output port of the second DAT circuit are coupled to a coupling circuit physically located between the first output port of the first DAT circuit and the second output port of the second DAT circuit.

Example 21 is a DAT circuit, including the subject matter of examples 19-20, including or omitting elements, wherein the first output port and the second output port are electrically connected to one another at the coupling circuit.

Example 22 is a DAT circuit, including the subject matter of examples 19-21, including or omitting elements, wherein the coupling circuit comprises a radio frequency (RF) pad configured to be coupled to a load circuit.

Example 23 is a DAT circuit, including the subject matter of examples 19-22, including or omitting elements, wherein the coupling circuit comprises a load circuit.

Example 24 is a DAT circuit, including the subject matter of examples 19-23, including or omitting elements, wherein the at least two input ports associated with the first primary circuit and the second primary circuit comprise differential input ports, and wherein the first output port and the second output port comprise single-ended output ports.

Example 25 is a DAT circuit, including the subject matter of examples 19-24, including or omitting elements, wherein the at least two input ports associated with the first primary circuit comprises a first input port configured to receive a first input signal and a second, different, input port configured to receive a second input signal; and wherein the at least two input ports associated with the second primary winding circuit comprises a third input port configured to receive a third input signal and a fourth, different, input port configured to receive a fourth input signal.

Example 26 is a DAT circuit, including the subject matter of examples 19-25, including or omitting elements, wherein the first primary winding circuit associated with the first DAT circuit further comprises a first conductive line having a first end and a second, different end, wherein the first end is coupled to a first segment of the first primary conductive loop coupled between the first input port and the second input port, and the second end is coupled to a second, different, segment of the first primary conductive loop coupled between the first input port and the second input port.

Example 27 is a DAT circuit, including the subject matter of examples 19-26, including or omitting elements, wherein the second primary winding circuit associated with the second DAT circuit further comprises a second conductive line having a first end and a second, different end, wherein the first end is coupled to a first segment of the second primary conductive loop coupled between the third input port and the fourth input port, and the second end is coupled to a second, different, segment of the second primary conductive loop coupled between the third input port and the fourth input port.

Example 28 is a DAT circuit, including the subject matter of examples 19-27, including or omitting elements, wherein the first DAT circuit further comprises a first dummy winding circuit comprising a first dummy conductive loop having a first dummy port comprising a first dummy terminal that is grounded and a second, different, dummy terminal that is floating, wherein the first dummy conductive loop is physically arranged in a way that the first primary conductive loop is located between the first secondary conductive loop and the first dummy conductive loop.

Example 29 is a DAT circuit, including the subject matter of examples 19-28, including or omitting elements, wherein the second DAT circuit further comprises a second dummy winding circuit comprising a second dummy conductive loop having a second dummy port comprising a first dummy terminal that is grounded and a second, different, dummy terminal that is floating, wherein the second dummy conductive loop is physically arranged in a way that the second primary conductive loop is located between the second secondary conductive loop and the second dummy conductive loop.

Example 30 is a stacked differential amplifier circuit, comprising a differential amplifier circuit comprising a first differential output terminal and a second differential output terminal; and a stacked amplifier circuit, comprising a first stacked transistor circuit comprising a first stacked terminal coupled to the first differential output terminal of the differential amplifier circuit; and a second stacked transistor circuit comprising a fourth stacked terminal coupled to the second differential output terminal of the differential amplifier circuit; wherein the differential amplifier circuit comprises a plurality of unit cell amplifier circuits in parallel, each unit cell amplifier circuit comprising a first unit cell transistor circuit comprising a first transistor terminal and a second transistor terminal; and a second unit cell transistor circuit comprising a fourth transistor terminal and a fifth transistor terminal, wherein the first transistor terminal of the first unit cell transistor circuit and the fourth transistor terminal of the second unit cell transistor circuit are coupled to one another to form a differential arrangement; wherein the second transistor terminal of the first unit cell transistor circuit associated with each of the unit cell amplifier circuits are coupled together to form the first differential output terminal; wherein the fifth transistor terminal of the second unit cell transistor circuit associated with each of the unit cell amplifier circuits are coupled together to form the second differential output terminal; and wherein each of the unit cell amplifier circuits is configured to be selectively activated or deactivated, based on the output requirements of the stacked differential amplifier circuit.

Example 31 is a stacked differential amplifier circuit, including the subject matter of example 30, including or omitting elements, wherein each of the unit cell amplifier circuit further comprises a respective tail current switch circuit coupled to a differential conductive line that couples the first transistor terminal of the first unit cell transistor circuit and the fourth transistor terminal of the second unit cell transistor circuit, and wherein the tail current switch circuit is configured to selectively activate or deactivate the respective unit cell amplifier circuit.

Example 32 is a stacked differential amplifier circuit, including the subject matter of examples 30-31, including or omitting elements, further comprising a control circuit configured to turn on or turn off one or more of the tail current switch circuits digitally, in order to selectively activate or deactivate the respective unit cell amplifier circuits.

Example 33 is a slacked differential amplifier circuit, including the subject matter of examples 30-32, including or omitting elements, wherein the first transistor terminal and the second transistor terminal of first unit cell transistor circuit comprises a source terminal and a drain terminal respectively, and wherein the fourth transistor terminal and the fifth transistor terminal of second unit cell transistor circuit comprises a source terminal and a drain terminal respectively.

Example 34 is a stacked differential amplifier circuit, including the subject matter of examples 30-33, including or omitting elements, wherein each of the unit cell amplifier circuit further comprises a first neutralization capacitance between the drain terminal of the first unit cell transistor circuit and a gate terminal of the second unit cell transistor circuit, and a second neutralization capacitance between the drain terminal of the second unit cell transistor circuit and a gate terminal of the first unit cell transistor circuit.

Example 35 is a stacked differential amplifier circuit, including the subject matter of examples 30-34, including or omitting elements, further comprising a differential shunt stub circuit having a first end and a second, different end, wherein the first end is coupled to a first conductive line that couples the first differential output terminal of the differential amplifier circuit to the first stacked terminal of the first stacked transistor circuit and wherein the second end is coupled to a second conductive line that couples the second differential output terminal of the differential amplifier circuit to the fourth stacked terminal of the second stacked transistor circuit.

Various illustrative logics, logical blocks, modules, and circuits described in connection with aspects disclosed herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A stacked differential amplifier circuit to receive a differential input signal and generate a differential output signal, the stacked differential amplifier circuit comprising:
   a differential amplifier circuit configured to receive the differential input signal, the differential amplifier circuit comprising a plurality of unit cell amplifier circuits arranged in parallel, each of the unit cell amplifier circuits configured to be selectively activated or deactivated by a corresponding tail current switch circuit; and
   a stacked amplifier circuit configured to generate the differential output signal based on an output from the differential amplifier circuit.

2. The stacked differential amplifier circuit of claim 1, wherein each corresponding tail current switch circuit is coupled to an associated differential line that couples a source terminal of a first unit cell transistor circuit of a corresponding unit cell amplifier circuit and a source terminal of a second unit cell transistor circuit of the corresponding unit cell amplifier circuit.

3. The stacked differential amplifier circuit of claim 2, wherein the tail current switch circuits are configured to turn-on or turn-off in response to a digital control signal, in order to selectively activate or deactivate a corresponding one of the unit cell amplifier circuits.

4. The stacked differential amplifier circuit of claim 3, further comprising a control circuit configured to generate the digital control signal to either turn-on or turn-off each of the tail current switch circuits digitally, in order to selectively activate or deactivate the corresponding unit cell amplifier circuits based on output requirements of the stacked differential amplifier circuit.

5. The stacked differential amplifier circuit of claim 4, wherein the stacked differential amplifier circuit is configured to operate as a power amplifier, and
   wherein during back-off operation when the power amplifier is configured to generate an output power lower than a maximum output power, the control circuit is to deactivate one or more of the unit cell amplifier circuits so that the unit cell amplifier circuits that are active operate at or close to a peak output power.

6. The stacked differential amplifier circuit of claim 3, wherein the source terminal of the first unit cell transistor circuit and the source terminal of the second unit cell transistor circuit are coupled to one another to form a differential arrangement,
wherein a drain terminal of the first unit cell transistor circuit associated with each of the unit cell amplifier circuits are coupled together to form a first differential output terminal associated with the differential amplifier circuit, and
wherein a drain terminal of the second unit cell transistor circuit associated with each of the unit cell amplifier circuits are coupled together to form a second differential output terminal associated with the differential amplifier circuit.

7. The stacked differential amplifier circuit of claim 6, wherein each of the unit cell amplifier circuit further comprises a first neutralization capacitance between the drain terminal of the first unit cell transistor circuit and a gate terminal of the second unit cell transistor circuit, and a second neutralization capacitance between the drain terminal of the second unit cell transistor circuit and a gate terminal of the first unit cell transistor circuit.

8. The stacked differential amplifier circuit of claim 7, further comprising a differential shunt stub circuit having a first end and a second end,
wherein the first end is coupled to a first conductive line that couples the first differential output terminal of the differential amplifier circuit to the stacked amplifier circuit, and
wherein the second end is coupled to a second conductive line that couples the second differential output terminal of the differential amplifier circuit to the stacked amplifier circuit.

9. The stacked differential amplifier circuit of claim 8, wherein the stacked amplifier circuit comprises:
a first stacked transistor circuit comprising a first stacked terminal coupled to the first differential output terminal of the differential amplifier circuit by the first conductive line; and
a second stacked transistor circuit comprising a fourth stacked terminal coupled to the second differential output terminal of the differential amplifier circuit by the second conductive line.

10. A stacked differential amplifier circuit, comprising:
a differential amplifier circuit comprising a first differential output terminal and a second differential output terminal; and
a stacked amplifier circuit, comprising:
a first stacked transistor circuit comprising a first stacked terminal coupled to the first differential output terminal of the differential amplifier circuit; and
a second stacked transistor circuit comprising a fourth stacked terminal coupled to the second differential output terminal of the differential amplifier circuit;
wherein the differential amplifier circuit comprises a plurality of unit cell amplifier circuits in parallel, each unit cell amplifier circuit comprising:
a first unit cell transistor circuit comprising a first transistor terminal and a second transistor terminal; and
a second unit cell transistor circuit comprising a fourth transistor terminal and a fifth transistor terminal, wherein the first transistor terminal of the first unit cell transistor circuit and the fourth transistor terminal of the second unit cell transistor circuit are coupled to one another to form a differential arrangement;
wherein the second transistor terminal of the first unit cell transistor circuit associated with each of the unit cell amplifier circuits are coupled together to form the first differential output terminal;
wherein the fifth transistor terminal of the second unit cell transistor circuit associated with each of the unit cell amplifier circuits are coupled together to form the second differential output terminal; and
wherein each of the unit cell amplifier circuits is configured to be selectively activated or deactivated, based on output requirements of the stacked differential amplifier circuit.

11. The stacked differential amplifier circuit of claim 10, wherein each of the unit cell amplifier circuit further comprises a respective tail current switch circuit coupled to a differential conductive line that couples the first transistor terminal of the first unit cell transistor circuit and the fourth transistor terminal of the second unit cell transistor circuit, and wherein the tail current switch circuit is configured to selectively activate or deactivate the respective unit cell amplifier circuit.

12. The stacked differential amplifier circuit of claim 11, further comprising a control circuit configured to turn on or turn off one or more of the tail current switch circuits digitally, in order to selectively activate or deactivate the respective unit cell amplifier circuits.

13. The stacked differential amplifier circuit of claim 10, wherein the first transistor terminal and the second transistor terminal of first unit cell transistor circuit comprises a source terminal and a drain terminal respectively, and wherein the fourth transistor terminal and the fifth transistor terminal of second unit cell transistor circuit comprises a source terminal and a drain terminal respectively.

14. The stacked differential amplifier circuit of claim 13, wherein each of the unit cell amplifier circuit further comprises a first neutralization capacitance between the drain terminal of the first unit cell transistor circuit and a gate terminal of the second unit cell transistor circuit, and a second neutralization capacitance between the drain terminal of the second unit cell transistor circuit and a gate terminal of the first unit cell transistor circuit.

15. The stacked differential amplifier circuit of claim 10, further comprising a differential shunt stub circuit having a first end and a second, different end, wherein the first end is coupled to a first conductive line that couples the first differential output terminal of the differential amplifier circuit to the first stacked terminal of the first stacked transistor circuit and wherein the second end is coupled to a second conductive line that couples the second differential output terminal of the differential amplifier circuit to the fourth stacked terminal of the second stacked transistor circuit.

16. A method for amplifying a differential input signal and generating a differential output signal with a stacked differential amplifier circuit comprising a differential amplifier circuit and a stacked amplifier circuit, the method comprising:
receiving the differential input signal by the differential amplifier circuit, the differential amplifier circuit comprising a plurality of unit cell amplifier circuits in parallel;
generating the differential output signal by the stacked amplifier circuit based on an output from the differential amplifier circuit; and selectively activating or deactivating one or more of the unit cell amplifier circuits by a corresponding tail current switch circuit.

17. The method of claim 16, wherein each corresponding tail current switch circuit is coupled to an associated differential line that couples a source terminal of a first unit cell transistor circuit of a corresponding unit cell amplifier circuit and a source terminal of a second unit cell transistor circuit of the corresponding unit cell amplifier circuit.

18. The method of claim 17, further comprising turning on or off one or more of the tail current switch circuits in response to a digital control signal, to selectively activate or deactivate a corresponding one of the unit cell amplifier circuits.

19. The method of claim 18, further comprising generating the digital control signal with a control circuit to either turn-on or turn-off each of the tail current switch circuits digitally, in order to selectively activate or deactivate the corresponding unit cell amplifier circuits based on output requirements of the stacked differential amplifier circuit.

20. The method of claim 19, wherein the stacked differential amplifier circuit is configured to operate as a power amplifier, and
wherein during back-off operation when the power amplifier is configured to generate an output power lower than a maximum output power, the method comprises configuring the control circuit to deactivate one or more of the unit cell amplifier circuits so that the unit cell amplifier circuits that are active operate at or close to a peak output power.

21. The method of claim 18, wherein the source terminal of the first unit cell transistor circuit and the source terminal of the second unit cell transistor circuit are coupled to one another to form a differential arrangement,
wherein a drain terminal of the first unit cell transistor circuit associated with each of the unit cell amplifier circuits are coupled together to form a first differential output terminal associated with the differential amplifier circuit,
wherein a drain terminal of the second unit cell transistor circuit associated with each of the unit cell amplifier circuits are coupled together to form a second differential output terminal associated with the differential amplifier circuit, and
wherein the method comprises generating the differential output signal at the first and second differential output terminal associated with the differential amplifier circuit.

* * * * *